(12) United States Patent
Yamagata et al.

(10) Patent No.: US 9,145,325 B2
(45) Date of Patent: Sep. 29, 2015

(54) SILICA CONTAINER AND METHOD FOR PRODUCING THE SAME

(71) Applicant: SHIN-ETSU QUARTZ PRODUCTS CO., LTD., Tokyo (JP)

(72) Inventors: Shigeru Yamagata, Narashino (JP); Tomomi Usui, New Delhi (IN)

(73) Assignee: SHIN-ETSU QUARTZ PRODUCTS CO., LTD., Tokyo (JP)

(*) Notice: Subject to any disclaimer, the term of this patent is extended or adjusted under 35 U.S.C. 154(b) by 0 days.

(21) Appl. No.: 14/304,530

(22) Filed: Jun. 13, 2014

(65) Prior Publication Data

US 2014/0290308 A1 Oct. 2, 2014

Related U.S. Application Data

(62) Division of application No. 13/131,987, filed as application No. PCT/JP2010/004228 on Jun. 25, 2010, now Pat. No. 8,815,403.

(30) Foreign Application Priority Data

Aug. 5, 2009 (JP) ................................ 2009-182610

(51) Int. Cl.
*C03B 19/09* (2006.01)
*C30B 15/10* (2006.01)
(Continued)

(52) U.S. Cl.
CPC .............. *C03B 19/095* (2013.01); *C30B 15/10* (2013.01); *C30B 29/06* (2013.01); *C30B 35/002* (2013.01);
(Continued)

(58) Field of Classification Search
CPC ............................. C03B 19/09; C03B 19/095
USPC ........................................................... 65/17.3
See application file for complete search history.

(56) References Cited

U.S. PATENT DOCUMENTS 4,935,046 A 6/1990 Uchikawa et al.
5,145,510 A 9/1992 Saito et al.
(Continued)

FOREIGN PATENT DOCUMENTS

CN 1540041 A 10/2004
JP A-1-148782 6/1989
(Continued)

OTHER PUBLICATIONS

Dodd et al., "Optical Determinations of OH in Fused Silica," Journal of Applied Physics, 1966, pp. 3911, vol. 37.
(Continued)

*Primary Examiner* — Joseph D Del Sole
*Assistant Examiner* — Russell Kemmerle, III
(74) *Attorney, Agent, or Firm* — Oliff PLC

(57) ABSTRACT

A method for producing a silica container having a rotational symmetry includes forming a preliminarily molded article by feeding a powdered substrate's raw material to an inner wall of an outer frame having aspiration holes with rotating the frame, and forming a silica substrate. The preliminarily molded article is aspirated from an outer peripheral side with controlling a humidity inside the outer frame by ventilating gases present in the outer frame with charging from inside the preliminarily molded article a gas mixture comprised of an O2 gas and an inert gas and made below a prescribed dew-point temperature by dehumidification, and at the same time heated from inside the preliminarily molded article by a discharge-heat melting method with carbon electrodes, thereby making an outer peripheral part of the preliminarily molded article to a sintered body while an inner peripheral part to a fused glass body.

11 Claims, 6 Drawing Sheets

(51) Int. Cl.
*C30B 29/06* (2006.01)
*C30B 35/00* (2006.01)

(52) U.S. Cl.
CPC ....... *C03B 2201/07* (2013.01); *C03B 2201/075* (2013.01); *C03B 2201/32* (2013.01); *Y10T 428/131* (2015.01); *Y10T 428/1317* (2015.01); *Y10T 428/2982* (2015.01)

(56) References Cited

U.S. PATENT DOCUMENTS

| | | | |
|---|---|---|---|
| 5,174,801 A | 12/1992 | Matsumura et al. | |
| 5,885,071 A | 3/1999 | Watanabe et al. | |
| 5,976,247 A | 11/1999 | Hansen et al. | |
| 5,989,021 A | 11/1999 | Sato et al. | |
| 6,106,610 A | 8/2000 | Watanabe et al. | |
| 6,660,671 B2 | 12/2003 | Werdecker et al. | |
| 7,299,658 B2 | 11/2007 | Ohama et al. | |
| 8,047,020 B2 * | 11/2011 | Fujita et al. | 65/17.3 |
| 8,281,620 B1 * | 10/2012 | Sudo et al. | 65/144 |
| 8,420,192 B2 * | 4/2013 | Yamagata et al. | 428/34.6 |
| 2002/0017114 A1 | 2/2002 | Fukui et al. | |
| 2003/0074920 A1 * | 4/2003 | Ohama et al. | 65/17.4 |
| 2005/0000404 A1 | 1/2005 | Kishi et al. | |
| 2006/0174651 A1 | 8/2006 | Ohama et al. | |
| 2010/0162760 A1 * | 7/2010 | Fujita et al. | 65/65 |
| 2011/0017128 A1 * | 1/2011 | Harada et al. | 117/208 |
| 2014/0041575 A1 * | 2/2014 | Yamagata | 117/208 |

FOREIGN PATENT DOCUMENTS

| | | |
|---|---|---|
| JP | B2-4-22861 | 4/1992 |
| JP | A-7-206451 | 8/1995 |
| JP | B2-7-206451 | 8/1995 |
| JP | A-7-277743 | 10/1995 |
| JP | A-7-277744 | 10/1995 |
| JP | A-9-255476 | 9/1997 |
| JP | A-10-25184 | 1/1998 |
| JP | A-11-171684 | 6/1999 |
| JP | A-11-199369 | 7/1999 |
| JP | A-2000-72594 | 3/2000 |
| JP | B2-3046545 | 5/2000 |
| JP | B2-3100836 | 10/2000 |
| JP | A-2002-362932 | 12/2002 |
| JP | A-2004-131380 | 4/2004 |
| JP | A-2004-262690 | 9/2004 |
| WO | WO 2009/113525 A1 | 9/2009 |

OTHER PUBLICATIONS

Kikuchi et al., "OH Content Dependence of Viscosity of Vitreous Silica," Journal of the Ceramic Society of Japan, 1997, pp. 645-649, vol. 105—No. 8 (with Abstract).
Nasu et al., "Gas release of various kinds of vitreous silica," Journal of Illuminating Engineering Institute of Japan, 1990, pp. 595-600, vol. 74—No. 9.
Translation of Khotimchenko et al., "Determining the content of hydrogen dissolved in quartz glass using the methods of raman scattering and mass spectrometry," Zhurnal Prikladnoi Spektroskopii, Jun. 1987, pp. 632-635, vol. 46—No. 6.
International Search Report mailed Jul. 27, 2010 issued in International Patent Application No. PCT/JP2010/004228 (with translation).
Dec. 18, 2012 Korean Office Action issued in Korean Application No. 10-2011-7018621 (with partial translation).
Jun. 28, 2013 Taiwanese Office Action issued in Taiwanese Application No. 099121870 with partial English-language translation.
Jun. 27, 2013 Korean Office Action issued in Korean Application No. 10-2011-7018621 with partial English-language translation.
Oct. 8, 2013 Chinese Office Action issued in Chinese Application No. 2010800307984 with partial English-language translation.

* cited by examiner

SILICA CONTAINER AND METHOD FOR PRODUCING THE SAME

This is a divisional of application Ser. No. 13/131,987 filed May 31, 2011, which is a National Stage Application of PCT/JP2010/004228 filed Jun. 25, 2010, and claims the benefit of Japanese Patent Application No. 2009-182610 filed Aug. 5, 2009. The entire disclosures of the prior applications are incorporated by reference herein in their entirety.

TECHNICAL FIELD

The present invention relates to a silica container mainly comprised of a silica and to a method for producing it, and in particular, relates to a silica container with a low cost and a high dimensional precision and to a method for producing it.

BACKGROUND ART

A silica glass is used for a lens, a prism and a photomask of a photolithography instrument in manufacturing of a large-scale integrated circuit (LSI), for a TFT substrate used for a display, for a tube of a ultraviolet lamp or an infrared lamp, for a window material, for a reflection plate, for a cleaning container in a semiconductor industry, for a container for melting of a silicon semiconductor, and so forth. Accordingly, from the past, various methods for producing a silica glass have been proposed.

For example, in Patent Document 1, a method (sol-gel method) in which a silicon alkoxide is hydrolyzed to a silica sol, which is then gelated to a wet gel, then to a dry gel by drying, and finally to a transparent silica glass body by heating at high temperature is disclosed. In Patent Document 2, a method in which a transparent silica glass is obtained by a sol-gel method from a silica sol mixture solution formed of tetramethoxy silane or tetraethoxy silane and a silica sol solution containing silica fine particles is disclosed. In Patent Document 3, a method for producing a transparent silica glass by using a silicon alkoxide and silica glass fine particles as its main raw materials, wherein a heating process at a temperature range from 200 to 1300° C. is carried out under an oxygen gas-containing atmosphere, a further heating process to 1700° C. or higher is carried out under a hydrogen gas-containing atmosphere, and a heating process between the foregoing two heating processes is carried out under a reduced pressure atmosphere, is disclosed. In these conventional sol-gel methods, however, the produced silica glass had problems of a dimensional precision at the initial stage and a heat resistance under its use at high temperature thereafter; and in addition, not only there were problems of release of carbon fine particles and emission of large quantities of gases such as CO and $CO_2$ because of high carbon content, but also the cost thereof was not so cheap.

In Patent Document 4, a method (slip casting method), wherein at least two different kinds of silica glass particles, for example, silica glass fine particles and silica glass granules are mixed to obtain a water-containing suspension solution, which is then press molded and sintered at high temperature to obtain a silica-containing composite body, is disclosed. In Patent Document 5, a method, wherein a mixed solution (slurry) containing silica glass particles having the size of 100 μm or less and silica glass granules having the size of 100 μm or more is prepared, then the slurry is cast into a molding frame, dried, and then sintered to obtain an opaque silica glass composite material, is disclosed. In these conventional slip casting methods, however, shrinkage of a molded article in a drying process and a sintering process is so significant that a thick silica glass article with a high dimensional precision could not be obtained. In addition, because of high water content there were problems of the high OH concentration and of a large released of an $H_2O$ gas during its use at high temperature thereafter.

Accordingly, there are problems as mentioned above in the method for producing a silica glass article from a powdered raw material. Therefore, as a method for producing a silica crucible for manufacturing of a single crystal silicon used for LSI, such production methods as those disclosed in Patent Document 6 and Patent Document 7 are being used still today. In these methods, after a powdered ultra-highly purified natural quartz is fed into a rotating frame and then molded, carbon electrodes are inserted from the top and then electrically charged to cause arc discharge thereby raising the atmospheric temperature to a temperature range for melting of the powdered quartz (estimated temperature in the range from about 1800 to about 2100° C.) so that the powdered raw quartz may be melted and sintered.

In these methods, however, there has been a problem of a high cost because powdered raw material quartz with high purity is used. In addition, because various kinds of impure gases and a large quantity of fine carbon particles scattered from the carbon electrodes are dissolved or contained in a produced silica crucible, the gases are released and then incorporated into a single crystal silicon as gaseous bubbles when it is used as a silica crucible for growing of a single crystal silicon, thereby causing problems in production cost as well as quality of the silicon crystal. In addition, there has been a problem of a poor thermal distortion resistance of the silica crucible because side wall of the crucible is distorted by softening at the time of pulling up of a single crystal silicon.

In Patent Document 8, a silica crucible formed of three layers of an outer layer comprised of a natural quartz glass, an intermediate layer comprised of a synthetic quartz glass containing aluminum in high concentration, and an inner layer comprised of a high purity synthetic quartz glass, obtained from a powdered silica raw material by an arc-discharge melting method is described (it seems that the melting was carried out under an air atmosphere). In it, prevention effect of impurity migration by the intermediate layer is shown. However, not only a high cost of the three-layer structure having the structure as mentioned above but also the problems of thermal distortion resistance and of formation of voids and pinholes contained in a single crystal silicon have been remained unsolved.

In Patent Document 9, a technology to reduce gaseous bubbles in a wall of a melted quartz crucible by aspiration from a peripheral of a molding frame at the time of an arc-discharge melting of a molded article of a powdered raw material silica is shown.

However, dissolved gases in a wall of a melted quartz crucible could not be removed completely by mere aspiration of an air present in the powdered silica. It was only possible to produce a crucible containing a large quantity of residual gases, in particular, CO, $CO_2$ and $H_2O$.

In Patent Document 10, a silica crucible formed of three layers containing a crystallization facilitation agent, produced by a similar arc-discharge melting method, is shown.

However, when a single crystal silicon is pulled up by using this three-layered crucible, there have been problems that the crucible is not necessarily crystallized uniformly, defects such as voids and pinholes are formed in a grown single crystal silicon because of a large quantity of released gases from the crucible, and the thermal distortion takes place at the time of using the crucible.

CITATION LIST

Patent Document

Patent Document 1: Japanese Patent Application Laid-Open Publication No. H07-206451
Patent Document 2: Japanese Patent Application Laid-Open Publication No. H07-277743
Patent Document 3: Japanese Patent Application Laid-Open Publication No. H07-277744
Patent Document 4: Japanese Patent Application Laid-Open Publication No. 2002-362932
Patent Document 5: Japanese Patent Application Laid-Open Publication No. 2004-131380
Patent Document 6: Japanese Examined Patent Application Publication No. H04-22861
Patent Document 7: Japanese Examined Patent Application Publication No. H07-29871
Patent Document 8: Japanese Patent Application Laid-Open Publication No. H09-255476
Patent Document 9: Japanese Patent Application Laid-Open Publication No. H10-25184
Patent Document 10: Japanese Patent Application Laid-Open Publication No. H11-171684

SUMMARY OF THE INVENTION

Technical Problem to be Solved by the Invention

The present invention was made in view of the problems as mentioned above, and has an object to provide a method for producing a silica container comprised of a silica as the main component therein, having a high dimensional precision, and containing carbon and an OH group with extremely low amounts in almost entire region of the silica container, by using powders containing a silica as the main raw material with a low production cost, and an object to provide a silica container such as the one as mentioned above.

Solution to Problem

The present invention was made in order to solve the problems as mentioned above and provides a method for producing a silica container comprised of at least a silica as its main component and arranged with a silica substrate having a rotational symmetry, wherein the method comprises:

a step of preparing a powdered substrate's raw material comprised of silica particles for forming the silica substrate, a step of forming a preliminarily molded silica substrate, wherein the powdered substrate's raw material is fed to an inner wall of an outer frame having a rotational symmetry and aspiration holes arranged splittingly in the inner wall while rotating the outer frame thereby preliminarily molding the powdered substrate's raw material to an intended shape in accordance with the inner wall of the outer frame, and a step of forming the silica substrate, wherein the preliminarily molded silica substrate is degassed by aspiration from an outer peripheral side through the aspiration holes formed in the outer frame with controlling a humidity inside the outer frame by ventilating gases present in the outer frame with charging from inside the preliminarily molded silica substrate a gas mixture comprised of an $O_2$ gas and an inert gas and made below a prescribed dew-point temperature by dehumidification, and at the same time heated from inside the preliminarily molded silica substrate by a discharge-heat melting method with carbon electrodes, thereby making an outer peripheral part of the preliminarily molded silica substrate to a sintered body while an inner peripheral part of the preliminarily molded silica substrate to a fused glass body.

If the method for producing a silica container includes the steps as mentioned above, fine carbon particles scattered from the carbon electrodes are gasified by the oxidation treatment thereby enabling to reduce carbon (C) contained in the producing silica substrate to an extremely low amount; thus a harmful effect by carbon, carbon monoxide (CO), and carbon dioxide ($CO_2$) to a material accommodated in the produced silica container can be suppressed, and at the same time the thermal distortion resistance under the use condition of the produced silica container at high temperature can be improved because an OH group contained in the silica substrate can be lowered to an extremely low concentration so that viscosity of the silica substrate can be made higher.

In addition, the present invention can be executed without adding a special equipment and a process step to a conventional method, so that a silica container containing extremely low amounts of carbon and an OH group can be produced with a high dimensional precision, a high productivity, and a low cost.

The method for producing a silica container of the present invention can further include, after the step of forming the silica substrate by the discharge-heat melting method, a step of forming an inner layer formed of a transparent silica glass on an inner surface of the silica substrate, by spreading from inside the silica substrate a powdered inner-layer's raw material, comprised of silica particles and having a higher silica purity than the powdered substrate's raw material, with heating from inside the silica substrate by a discharge-heat melting method.

Accordingly, if the method for producing a silica container is made to include further a step of forming an inner layer formed of a transparent silica glass on an inner surface of the obtained silica substrate, impurity contamination to a material accommodated in the produced silica container can be reduced more effectively.

In this case, the powdered inner-layer's raw material can be made to the one that releases $H_2$ the amount of which is in the range from $1 \times 10^{16}$ to $1 \times 10^{19}$ molecules/g at 1000° C. under vacuum.

If the powdered inner-layer's raw material is doped with $H_2$, the release amount of which at 1000° C. under vacuum is in the range from $1 \times 10^{16}$ to $1 \times 10^{19}$ molecules/g, the powdered inner-layer's raw material contains an $H_2$ molecule releasing this amount of $H_2$ molecules, so that, because of the presence of this $H_2$ molecules, the amount of gaseous bubbles in the silica glass layer that constitutes the inner layer can be reduced to make the silica glass layer a more perfect transparent layer.

In addition, in the powdered inner-layer's raw material, it is preferable that each element concentration of Li, Na, and K be made 60 or less ppb by weight, and each element concentration of Ti, V, Cr, Fe, Co, Ni, Cu, Zn, Mo, and W be made 30 or less ppb by weight.

If the metals are contained in the powdered inner-layer's raw material with the concentrations as mentioned above, impurity contamination to a material accommodated in the produced silica container can be reduced more effectively.

In addition, in the method for producing a silica container of the present invention, it is preferable that the ratio of an $O_2$ gas contained in the gas mixture be in the range from 1 to 40% by volume.

If the ratio of an $O_2$ gas contained in the gas mixture is made to the range as mentioned above, carbon fine particles scattered can be removed more effectively.

In addition, it is preferable that the dehumidification be done such that a dew-point temperature of the gas mixture is 10° C. or lower.

If the dehumidification of the gas mixture is executed such that a dew-point temperature of the gas mixture may become 10° C. or lower as mentioned above, amount of an OH group contained in the silica container to be produced can be reduced effectively.

In addition, the powdered substrate's raw material can be made to contain aluminum in the concentration rage from 10 to 500 ppm by weight.

If the powdered substrate's raw material is made to contain aluminum in the concentration rage from 10 to 500 ppm by weight as mentioned above, diffusion of metal impurities in the silica substrate can be suppressed, so that impurity contamination to a material accommodated in the silica container can be reduced.

Further, the present invention provides a silica container comprised of at least a silica as its main component and arranged with a silica substrate having a rotational symmetry, wherein the silica substrate contains carbon in the concentration of 30 or less ppm by weight and an OH group in the concentration of 30 or less ppm by weight and has a white and opaque layer part containing gaseous bubbles in its outer peripheral part and a colorless and transparent layer part comprised of a silica glass not substantially containing gaseous bubbles in its inner peripheral part.

If the silica container is the one as mentioned above, amount of carbon (C) contained in the silica substrate is extremely small so that a harmful effect by carbon, carbon monoxide, and carbon dioxide to a material accommodated in the silica container can be suppressed; and at the same time, amount of an OH group contained in the silica substrate is extremely small thereby enabling to make viscosity of the silica substrate higher, so that the thermal distortion resistance of the silica container under the use condition at high temperature can be improved.

In this case, it is preferable that, when the colorless and transparent layer part of the silica substrate is heated at 1000° C. under vacuum, amounts of released gas molecules be $2 \times 10^{17}$ or less molecules/g for a CO molecule and $1 \times 10^{17}$ or less molecules/g for a $CO_2$ molecule.

If the released amounts of a CO molecule and a $CO_2$ molecule, when the colorless and transparent layer part of the silica substrate is heated at 1000° C. under vacuum, are the value as mentioned above, a harmful effect by a CO gas molecule and a $CO_2$ gas molecule to a material accommodated in the silica container can be suppressed more effectively.

In addition, it is preferable that, when the colorless and transparent layer part of the silica substrate is heated at 1000° C. under vacuum, amount of a released $H_2O$ molecule be $3 \times 10^{17}$ or less molecules/g.

If the released amount of an $H_2O$ molecule, when the colorless and transparent layer part of the silica substrate is heated at 1000° C. under vacuum, is $3 \times 10^{17}$ or less molecules/g, a harmful effect by an $H_2O$ gas molecule to a material accommodated in the silica container can be suppressed.

In addition, it is preferable that viscosity of the colorless and transparent layer part of the silica substrate at 1400° C. be $10^{10.4}$ Pa·s or higher.

If viscosity of the colorless and transparent layer part of the silica substrate at 1400° C. is $10^{10.4}$ Pa·s or higher as mentioned above, the silica container can be made to have a high thermal distortion resistance; and thus the silica container can be used with suppressed distortion even at such high temperature as, for example, 1400° C. or higher.

In addition, it is preferable that the silica substrate contain aluminum in the concentration range from 10 to 500 ppm by weight.

If the silica substrate contains aluminum in the concentration range from 10 to 500 ppm by weight as mentioned above, diffusion of metal impurities in the silica substrate can be suppressed so that impurity contamination to a material accommodated in the silica container can be reduced.

In addition, the silica container of the present invention can be arranged with, on an inner surface of the silica substrate, an inner layer formed of a transparent silica glass having a higher silica purity than the silica substrate.

If any of the silica containers as mentioned above is arranged with, on an inner surface of the silica substrate, an inner layer formed of a transparent silica glass having a higher silica purity than the silica substrate, impurity contamination to a material accommodated in the silica container can be reduced more effectively.

In this case, it is preferable that the inner layer contain carbon with the concentration of 30 or less ppm by weight, an OH group with the concentration of 30 or less ppm by weight, an element of Li, Na, and K with each element concentration of 60 or less ppb by weight, and an element of Ti, V, Cr, Fe, Co, Ni, Cu, Zn, Mo, and W with each element concentration of 30 or less ppb by weight.

If concentrations of carbon, an OH group, and each metal contained in the inner layer are in the values as mentioned above, impurity contamination to a material accommodated in the produced silica container can be reduced more effectively.

Advantageous Effects of the Invention

As described above, according to the method for producing a silica container of the present invention, amount of carbon (C) contained in the silica substrate to be produced can be made extremely small so that a harmful effect by carbon, carbon monoxide, and carbon dioxide to a material accommodated in the produced silica container can be suppressed; and at the same time the OH concentration contained in the silica substrate can be made extremely low so that viscosity of the silica substrate can be made high thereby enabling to improve the thermal distortion resistance under the use condition of the produced silica container at high temperature. In addition, the present invention can be executed without adding a special equipment and a process step to a conventional method so that the silica container containing extremely low amounts of carbon and an OH group can be produced in a high dimensional precision, a high productivity, and a low cost.

Further, according to the silica container of the present invention, a harmful effect by carbon, carbon monoxide, and carbon dioxide to a material accommodated in the silica container can be suppressed; and in addition, the thermal distortion resistance under the use condition of the silica container at high temperature can be improved.

DESCRIPTION OF EMBODIMENTS

Figure 1:
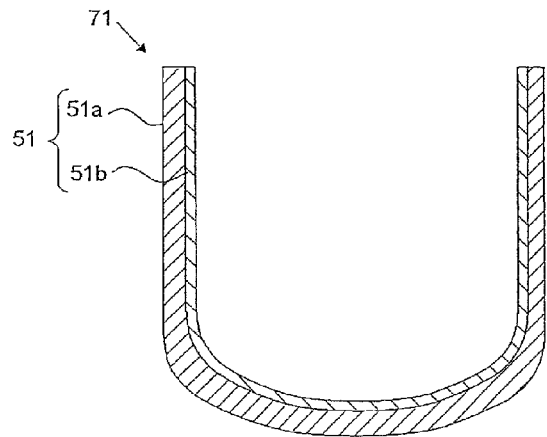
FIG. 1 is a schematic cross section view showing one example of the silica container of the present invention.

As mentioned above, in a conventional method for producing a silica container, there have been problems in a dimensional precision and in a cost.

In addition, a silica container produced by a conventional method for producing a silica container had a problem such as, for example, an effect of gases to a material accommodated therein caused by incorporation of gaseous bubbles into a silicon single crystal in a silica crucible for growing of a silicon single crystal.

The inventors of the present invention carried out investigation in view of the problems as mentioned above and found the following problems to be solved.

Firstly, a silica container such as a crucible and a boat for melting of a metal silicon and for production of a silicon crystal requires thermal uniformity inside the container under atmosphere of high temperature heating. Because of this, the first problem is to make the silica container at least a multi-layer structure, wherein an outside part of the container is made to a white and opaque porous silica glass while an inside part of the container is made to a colorless and transparent silica glass containing substantially little gaseous bubbles.

The second problem is to make the silica container contain reduced amounts of carbon fine particles and of dissolved gases such as an $H_2O$ gas (a water molecule), a CO gas (a carbon monoxide molecule), and a $CO_2$ gas (a carbon dioxide molecule).

This is to suppress a harmful effect to a material accommodated in the silica container by carbon fine particles and gaseous molecules such an $H_2O$ gas, a CO gas, and a $CO_2$ gas contained in the silica container.

For example, in the case of a silica container used for pulling up of a single crystal silicon, if carbon fine particles are contained in the silica container, the carbon fine particles contained in the silica container are released and dissolved into a silicon melt at the time when silicon crystal is produced; and therefore the carbon fine particles occasionally work as a crystal nucleating agent to inhibit growth of the single crystal silicon. In addition, if gaseous molecules such as an $H_2O$ gas, a CO gas, and a $CO_2$ gas are incorporated into the silica container, these gases are released into a silicon melt at the time when silicon crystal is produced and are then incorporated into a growing single crystal silicon as gaseous bubbles. The gaseous bubbles incorporated therein form a void and a pinhole when the single crystal silicon is made to a wafer, thereby leading to remarkable decrease in production yield.

As mentioned above, in the present invention, it was necessary to simultaneously solve these two technical problems with a lower cost as compare with a silica container such as a crucible for pulling up of a high purity single crystal silicon by a conventional method. Accordingly, the third problem to be solved was to obtain a low cost production method by using a cheap silica raw material not requiring a treatment for ultrahigh purification.

Hereinafter, the present invention will be explained in detail with referring to the figures, but the present invention is not limited to them. Particularly in the following, mainly a silica container (a solar-grade crucible) applicable as a container for melting of a metal silicon used as a material for a solar cell (a solar photovoltaic power generation, or a solar power generation) as well as a production method thereof will be mainly explained as one suitable example of application of the present invention; but the present invention is not limited to this and can be applied widely to a general silica container comprised of a silica as the main component and having a rotational symmetry.

In FIG. 1, a schematic cross section view of one example of the silica container of the present invention is shown.

The silica container 71 of the present invention has a rotational symmetry, and its basic structure is formed of the silica substrate 51. The silica substrate 51 contains carbon in the concentration of 30 or less ppm by weight and an OH group in the concentration of 30 or less ppm by weight.

The silica substrate 51 has a white and opaque layer part 51a containing gaseous bubbles in its outer peripheral part and a colorless and transparent layer part 51b comprised of a silica glass not substantially containing gaseous bubbles in its inner peripheral part.

Meanwhile, as far as the silica container of the present invention has at least the silica substrate 51, the silica container may further contain a layer other than the silica substrate.

Figure 2:
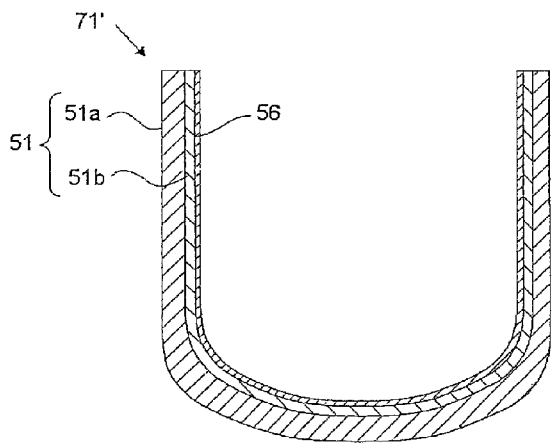
FIG. 2 is a schematic cross section view showing another example of the silica container of the present invention.

In FIG. 2, the silica container 71' arranged with the inner layer 56 formed of a transparent silica glass on an inner surface of the silica substrate 51 is shown as another example of the silica container of the present invention. It is preferable that a silica purity of the inner layer 56 be higher than that of the silica substrate 51.

Hereinafter, the silica substrate 51 that constitutes the silica container of the present invention will be specifically explained.

Firstly, the amounts of carbon (C) and an OH group contained in the silica substrate 51 are made in the concentration of 30 or less ppm by weight for carbon and in the concentration of 30 or less ppm by weight for an OH group. It is preferable that the concentration of carbon be 10 or less ppm by weight and the concentration of an OH group be 10 or less ppm by weight.

If the amounts of carbon C and an OH group contained in the silica substrate 51 are the values as mentioned above, the amount of carbon (C) contained in the silica substrate 51 is extremely small, so that a harmful effect by carbon, carbon monoxide, and carbon dioxide to a material accommodated in the silica container 71 or 71' can be suppressed; and at the same time the amount of an OH group contained in the silica substrate 51 is extremely small so that viscosity of the silica substrate 51 can be made higher, and thus the thermal distortion resistance under the use condition of the silica container 71 or 71' at high temperature can be improved.

The silica substrate 51 has a white and opaque layer part 51a containing gaseous bubbles in its outer peripheral part and a colorless and transparent layer part 51b comprised of a silica glass not substantially containing gaseous bubbles in its inner peripheral part, as mentioned above. Because the silica substrate 51 has the white and opaque layer part 51a and the colorless and transparent layer part 51b, as mentioned above, thermal uniformity inside the silica container under heating condition can be improved.

Bulk density of the white and opaque layer part 51a can be made, for example, in the range from 1.90 to 2.20 g/cm³, and bulk density of the colorless and transparent layer part 51b can be made typically about 2.20 g/cm³; but the present invention is not particularly limited to these values.

The silica containers 71 and 71' are used at high temperature under reduced pressure in many cases so that the amounts of released gases from the silica containers 71 and 71' need to be made small under such conditions. Accordingly, it is preferable that the amount of gas molecules released from the colorless and transparent layer part 51b when heated at 1000° C. under vacuum be $2 \times 10^{17}$ or less molecules/g for a CO molecule and $1 \times 10^{17}$ or less molecules/g for a $CO_2$ molecule.

In addition, when the colorless and transparent layer part 51b of the silica substrate is heated at 1000° C. under vacuum, the amount of a released $H_2O$ molecule therefrom is preferably $3 \times 10^{17}$ or less molecules/g, or more preferably $1 \times 10^{17}$ or less molecules/g.

As to an $H_2$ gas, it is preferable that the amount of an $H_2$ gas released from the colorless and transparent layer part 51b of the silica substrate when heated at 1000° C. under vacuum be $5 \times 10^{16}$ or less molecules/g.

If the amount of each gas molecules dissolved in the silica substrate 51 is suppressed as mentioned above, a harmful effect by each gas molecules to a material accommodated in the silica container can be reduced. For example, when the silica container 71 of the present invention is used for pulling up of a single crystal silicon, if the foregoing gases are released, the gases are incorporated into the silicon crystal to cause structural defects by gaseous bubbles such as so-called a void and a pinhole in the crystal; but according to the present invention, this harmful effect can be reduced.

In addition, by adding aluminum into the silica substrate 51 preferably in the concentration range from 10 to 500 ppm by weight or more preferably in the concentration range from 50 to 500 ppm by weight, adsorption and immobilization of impure metal elements become possible.

Details of a mechanism for aluminum to prevent migration and diffusion of impure metal elements in the silica glass from occurring is not known; but it is assumed that a positive ion (cation) of impure metal elements balances in its electric charge with a silica glass network by displacing Si with Al, resulting in adsorption as well as prevention of diffusion from occurring.

An additional effect of adding aluminum into the silica substrate 51 is to increase viscosity of a silica glass at high temperature thereby enabling to improve the thermal distortion resistance of the silica substrate 51 at high temperature; accordingly, the thermal distortion resistance of the silica containers 71 and 71' can be improved.

On the other hand, when concentration of an OH group is made 30 or less ppm by weight or preferably 10 or less ppm by weight as mentioned above, decrease of the viscosity of a silica glass at high temperature can be suppressed; and thus effects of adsorption and immobilization of the foregoing impure metal elements can be obtained.

In the present invention, viscosity of the silica substrate 51 can be increased by such methods as making concentration of an OH group in the silica substrate 51 to the foregoing value and adding aluminum; with this, the thermal distortion resistance of the silica containers 71 and 71' can be improved. Specifically, viscosity of the colorless and transparent layer part 51b of the silica substrate 51 at 1400° C. can be made to $10^{10.4}$ Pa·s or higher, or more preferably $10^{10.5}$ Pa·s or higher as well.

Meanwhile, viscosity of the colorless and transparent layer part 51b at 1400° C. can be calculated by a beam bending method and the like.

Then, the inner layer 56 of the silica container 71' shown in FIG. 2 will be explained.

The inner layer 56 is formed on an inner wall of the silica substrate 51 and formed of a transparent silica glass having a higher silica purity than the silica substrate.

If the inner layer 56 as mentioned above is formed, for example, silica purity of the silica substrate 51 can be made relatively low, in the range from 99.9 to 99.999% by weight. If the silica container 71' arranged with the inner layer 56 is used, impurity contamination to a material accommodated therein can be fully avoided even if the low-cost silica container having the silica substrate 51 with the silica purity as mentioned above is used.

Further, the concentration of carbon (C) contained in the inner layer 56 is preferably 30 or less ppm by weight and more preferably 10 or less ppm by weight, for the same reason as the concentration of carbon contained in the silica substrate 51.

In addition, it is preferable that the concentration of an OH group contained in the inner layer 56 be 30 or less ppm by weight and more preferably 10 or less ppm by weight. An OH group contained in the inner layer 56 has an effect to decrease the diffusion rate of impure metal elements, but on the contrary has an effect to decrease an etching resistance; and thus, the concentration is limited in an appropriate range.

It is preferable that the inner layer 56 contain each element of Li, Na, and K in the concentration of 60 or less ppb by weight, and each element of Ti, V, Cr, Fe, Co, Ni, Cu, Zn, Mo, and W in the concentration of 30 or less ppb by weight. More preferably, concentration of each element of Li, Na, and K is 20 or less ppb by weight and concentration of each element of Ti, V, Cr, Fe, Co, Ni, Cu, Zn, Mo, and W is 10 or less ppb by weight. With this, a harmful effect by these impure elements to a material to be treated can be reduced. Especially, in the case that a material to be treated is a silicon crystal for solar use, decrease in the incident photon-to-current conversion efficiency can be prevented so that quality of it can be made high.

Hereinafter, a method for producing the silica containers 71 and 71' as mentioned above will be explained specifically. Especially, a method for producing a silica container producible in a low cost (solar grade crucible) usable as a container for melting of a metal silicon (Si) and pulling up of a single crystal, used as a material for solar photovoltaic power generation device and the like, will be explained as the example.

Figure 3:
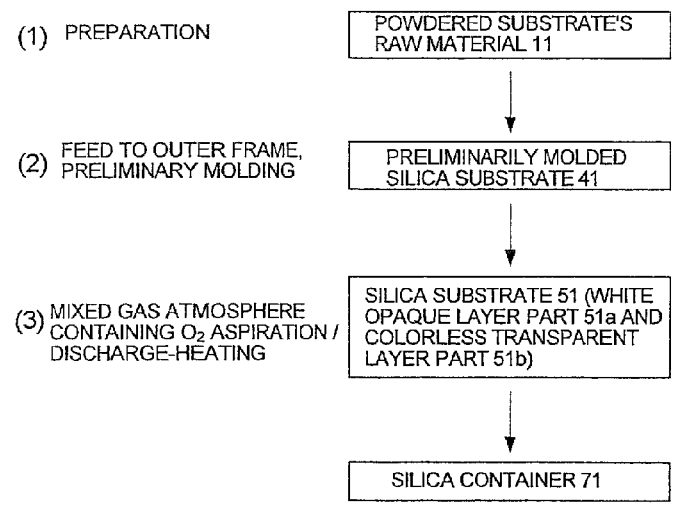
FIG. 3 is a flow chart showing outline of one example of the method for producing a silica container of the present invention.

A schematic diagram of the method for producing the silica container 71 of the present invention is shown in FIG. 3.

Firstly, a powdered substrate's raw material 11 comprised of silica particles is prepared as shown in FIG. 3 (1) (Step 1).

The powdered substrate's raw material 11 will become a main composition material of the silica substrate 51 in the silica containers 71 and 71' of the present invention (refer to FIG. 1 and FIG. 2).

The powdered substrate's raw material can be obtained by crushing mass of silica and granulating the powders thereby obtained, for example, by the method as described below, though not limited to it.

Firstly, mass of natural silica (a naturally produced berg crystal, a quartz, a silica, a silica stone, an opal stone, and the like) with diameter in the range from about 5 to about 50 mm is heated in the temperature ranging from 600 to 1000° C. for about 1 to about 10 hours under an air atmosphere. Then, the mass of natural silica thus treated is poured into water to be cooled down quickly, separated, and then dried. With these treatments, subsequent crushing by a crusher or the like and granulation of the obtained powders can be executed easily; but crushing treatment may be executed without executing the foregoing heating and quick cooling treatments.

Then, mass of the natural silica thus treated is crushed by a crusher or the like, and then granulated to the particle diameter controlled preferably in the range from 10 to 1000 μm, or more preferably in the range from 50 to 500 μm, to obtain a powdered natural silica.

Thereafter, the powdered natural silica thus obtained is heated in the temperature range from 700 to 1100° C. for about 1 hour to about 100 hours in a rotary kiln formed of a silica glass tube having an inclination angle, inside of which is made to an atmosphere containing a hydrogen chloride gas (HCl) or a chlorine gas ($Cl_2$) for high-purification treatment. However, for the use not requiring a high purity, this treatment for high purification may be omitted to proceed to the subsequent steps.

The powdered substrate's raw material 11 obtained after the foregoing steps is a crystalline silica; but depending on the use purpose of the silica container, an amorphous silica glass scrap may be alternatively used as the powdered substrate's raw material 11.

Diameter of the powdered substrate's raw material 11 is preferably in the range from 10 to 1000 μm, or more preferably in the range from 50 to 500 μm, as mentioned above.

Silica purity of the powdered substrate's raw material 11 is preferably 99.99% or higher by weight, or more preferably 99.999% or higher by weight. According to the method for producing a silica container of the present invention, even if silica purity of the powdered substrate's raw material 11 is made relatively low, such a 99.999% or lower by weight, impurity contamination to a material accommodated in the produced silica container can be fully avoided. Accordingly, the silica container can be produced with a lower cost as compared with the conventional methods.

When the silica container 71' arranged with the inner layer 56 as shown in FIG. 2 is produced (this method will be described later), especially a silica purity of the powdered substrate's raw material 11 can be lowered; for example, a purity of 99.9% or higher by weight may be allowed.

Further, the powdered substrate's raw material 11 may be made to contain aluminum preferably in the range from 10 to 500 ppm by weight.

Aluminum is added, for example, as an aqueous or alcoholic solution of an aluminum salt of nitrate, acetate, carbonate, chloride, and the like; and into a solution thereof a powdered silica is added and soaked, and then dried.

In the present invention, it is preferable that, in a step of preparing the powdered substrate's raw material 11, concentration of an OH group contained in the powdered substrate's raw material 11 be as low as possible.

The amount of an OH group contained in the powdered substrate's raw material 11 may be as it is contained in the natural silica stone from the beginning; or alternatively the amount of water to be incorporated in the intermediate step can be controlled by gas atmosphere, treatment temperature, and time, in a step of drying followed thereafter; but, at any rate, it is preferable that content of an OH group be as low as possible in the present invention.

After the powdered substrate's raw material 11 is prepared as mentioned above, the powdered substrate's raw material is fed into an outer frame having a rotational symmetry for molding of the powdered substrate's raw material 11, as shown in FIG. 3 (2) (Step 2).

Figure 5:
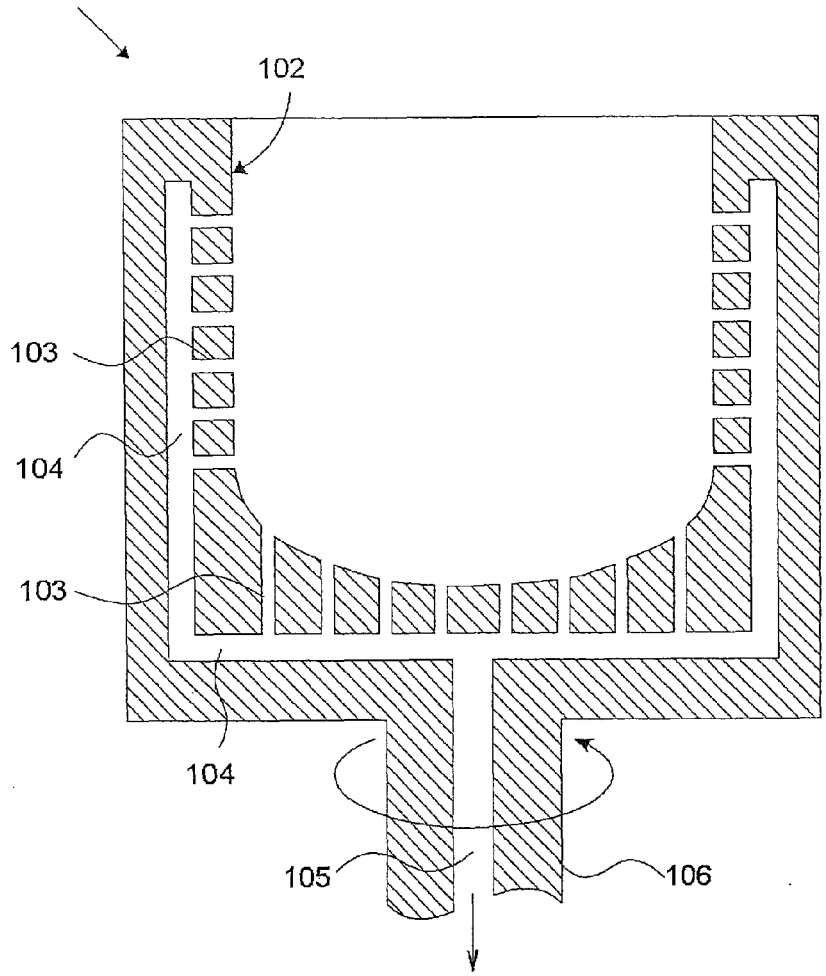
FIG. 5 is a schematic cross section view showing one example of the outer frame usable in the method for producing a silica container of the present invention.

In FIG. 5, a schematic cross section view of the outer frame for preliminary molding of the powdered substrate's raw material 11 is shown. The outer frame 101 used in the present invention is formed of, for example, a material member such as graphite and has a rotational symmetry. In the inner wall 102 of the outer frame 101, the aspiration holes 103 are arranged splittingly. The aspiration holes 103 are connected to the aspiration path 104. The rotation axis 106 to rotate the outer frame 101 is also arranged with the aspiration path 105, through which aspiration can be done.

Figure 6:
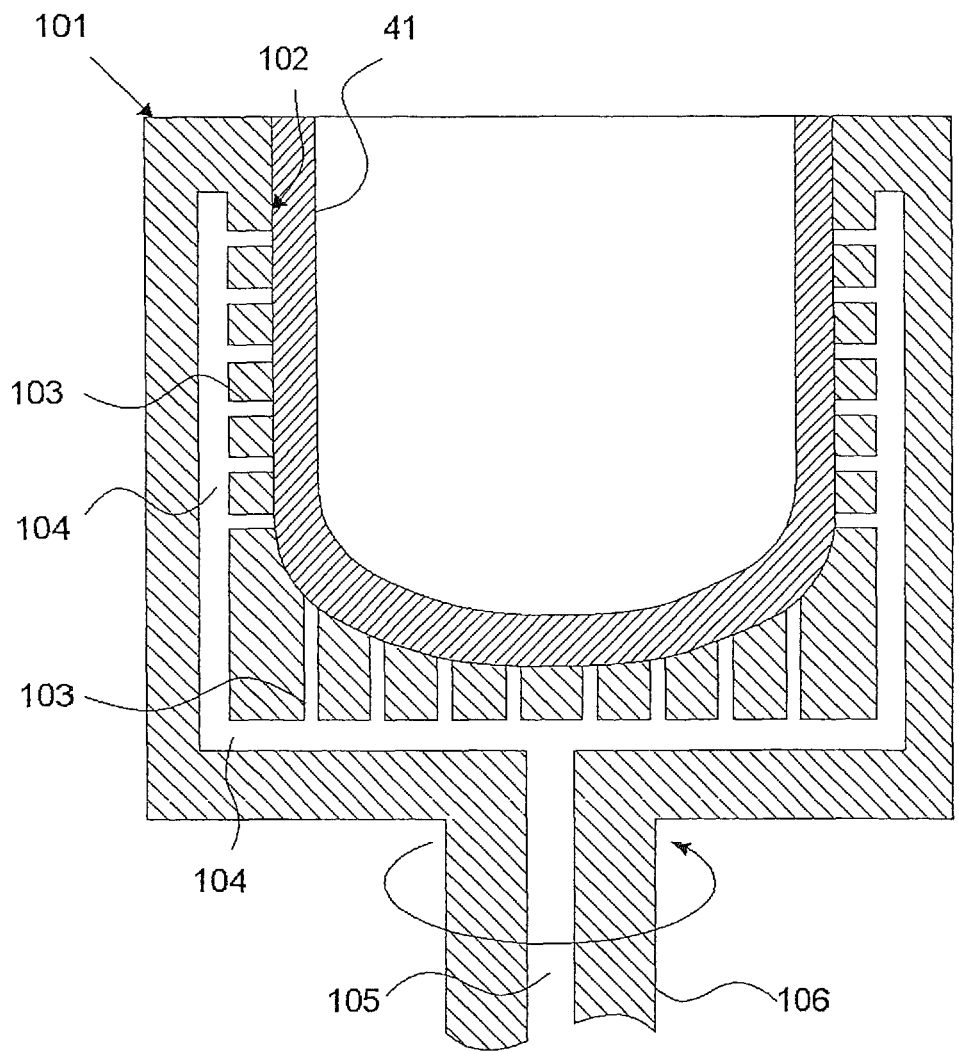
FIG. 6 is a schematic cross section view schematically showing one example of the step of forming the preliminarily molded silica substrate in the method for producing a silica container of the present invention.

The powdered substrate's raw material 11 is fed into the inner wall 102 of the outer frame 101 to preliminarily mold the powdered substrate's raw material 11 to a prescribed shape in accordance with the inner wall 102 of the outer frame 101 thereby giving the preliminarily molded silica substrate 41 (refer to FIG. 6).

Specifically, the powdered substrate's raw material 11 is fed gradually into the inner wall 102 of the outer frame 101 from a hopper for the powdered raw material (not shown) while rotating the outer frame 101 thereby molding to a shape of the container by utilizing the centrifugal force. Alternatively, thickness of the preliminarily molded silica substrate 41 may be controlled to the prescribed value by contacting a plate-like inner frame (not shown) to the rotating powders from inside.

A feeding method of the powdered substrate's raw material 11 into the outer frame 101 is not particularly limited; for example, a hopper equipped with an agitation screw and with a measuring feeder may be used. In this case, the powdered substrate's raw material 11 filled in the hopper is fed with agitating by the agitation screw while controlling the feeding amount by the measuring feeder.

Then, as shown in FIG. 3 (3), the silica substrate 51 is formed by the discharge-heat melting method under aspiration (Step 3).

Figure 7:
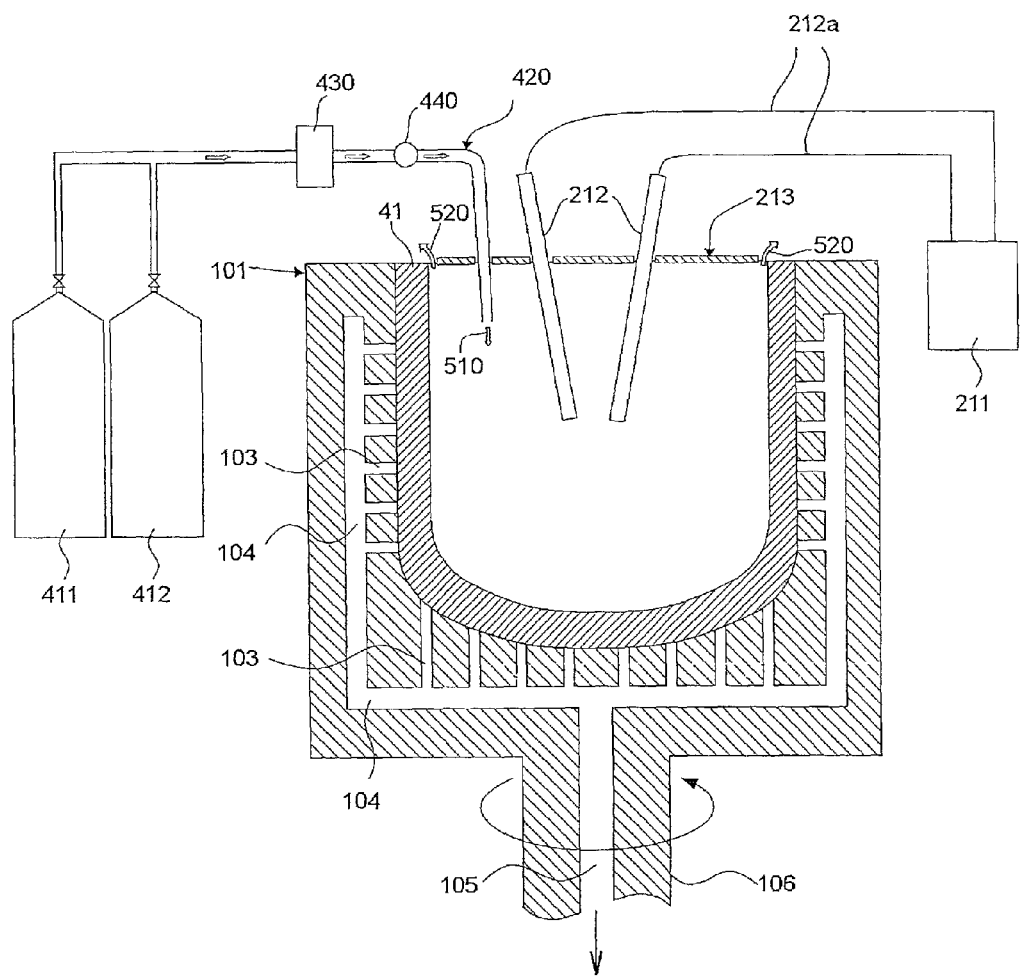
FIG. 7 is a schematic cross section view schematically showing a part of one example of the step of forming the silica substrate (before discharge-heat melting) in the method for producing a silica container of the present invention.
Figure 8:
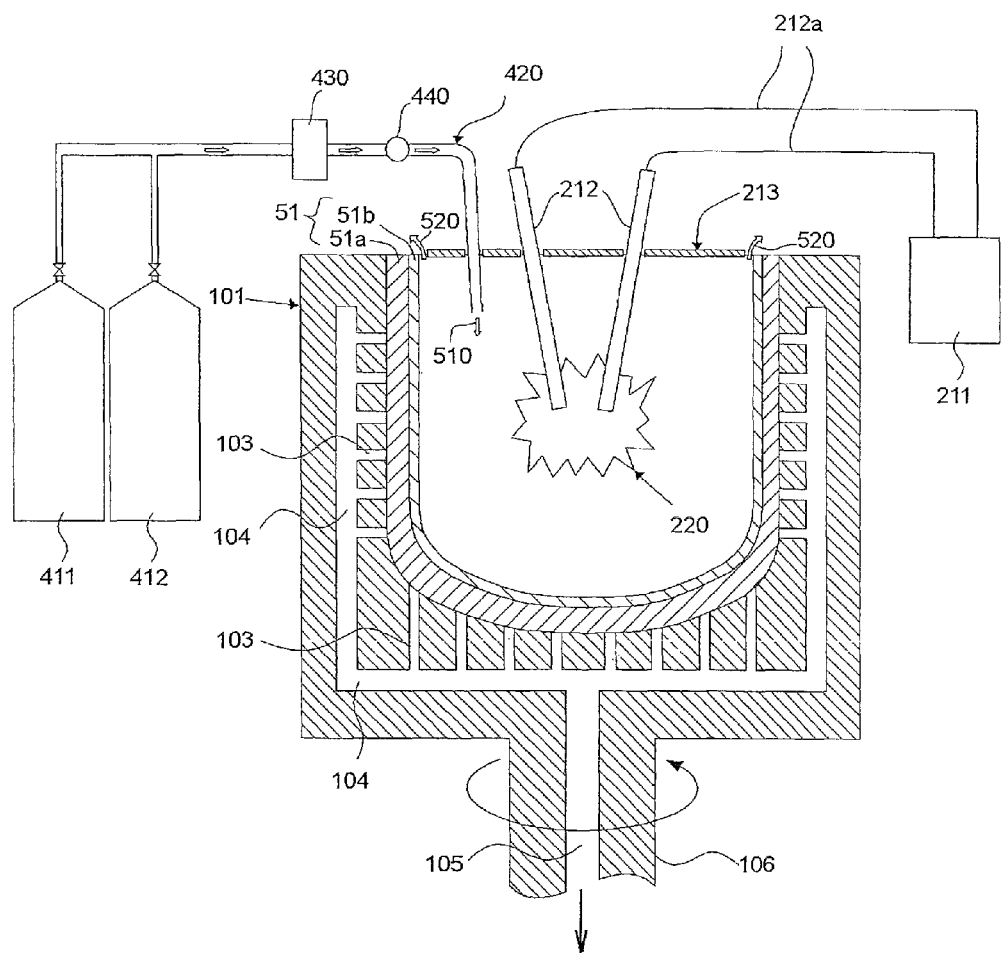
FIG. 8 is a schematic cross section view schematically showing a part of one example of the step of forming the silica substrate (during discharge-heat melting) in the method for producing a silica container of the present invention.

Specifically, as shown in FIG. 7 and FIG. 8, the preliminarily molded silica substrate 41 is degassed by aspiration from the outer peripheral side of the preliminarily molded silica substrate 41 through the aspiration holes 103 formed in the outer frame 101, while simultaneously heating from inside of the preliminarily molded silica substrate by the discharge-heat melting method. With this, the silica substrate 51 having a sintered body in the outer peripheral part of the preliminarily molded silica substrate 41 and a fused glass body in the inner part of the preliminarily molded silica substrate 41 is formed. At this time, the foregoing melting and sintering are executed by the discharge-heating method with controlling a humidity inside the outer frame 101 by ventilating the gases present in the outer frame 101 with charging from inside the preliminarily molded silica substrate 41 a gas mixture comprised of an $O_2$ gas and an inert gas and made below a prescribed dew-point temperature by dehumidification.

The equipment for forming the silica substrate 51 is comprised of, in addition to the rotatable outer frame 101 having a revolution axis symmetry as mentioned above, the rotation motor (not shown), the carbon electrodes 212 which are the heat source of the discharge-heat melting (sometimes called arc melting or arc discharge melting), the electric wirings 212a, the high voltage electricity source unit 211, the cap 213, and so forth. In addition, structural components to control an atmospheric gas to be charged from inside the preliminarily molded silica substrate, for example, the $O_2$ gas-supplying cylinder 411, the inert gas-supplying cylinder 412, the gas mixture-supplying pipe 420, the dehumidifying equipment 430, the dew-point-temperature-measuring thermometer 440, and so forth are arranged.

Meanwhile, the equipment can also be used successively for formation of the inner layer 56 on the inner surface of the silica substrate 51, as will be described later.

Procedures for melting and sintering of the preliminarily molded silica substrate 41 are as following; before start of the electricity charge between the carbon electrodes 212, charge of a gas mixture, comprised of an $O_2$ gas and an inert gas and made below a prescribed dew-point temperature by dehumidification, from inside the preliminarily molded silica substrate 41 is started. Specifically, as shown in FIG. 7, an $O_2$ gas in the $O_2$ gas-supplying cylinder 411 and an inert gas (for example, nitrogen ($N_2$), argon (Ar), and helium (He)) in the inert gas-supplying cylinder 412 are mixed and charged from inside the preliminarily molded silica substrate 41 through the gas mixture-supplying pipe 420. Meanwhile, white hollow arrows shown by the code number 510 show the flow direction of the gas mixture.

Dehumidification can be done by an appropriate dehumidifying equipment and the like, and measurement of the dew point temperature can be done with an appropriate dew-point-temperature-measuring thermometer and the like. In FIG. 7, an embodiment in which the dehumidifying equipment 430 and the dew-point-temperature-measuring thermometer 440 are integrated to the gas mixture-supplying pipe 420 is shown, but the embodiment is not limited to this; any embodiment enabling to make the dew point temperature of the gas mixture below a prescribed value can be used.

At this time, a gas in the outer frame 101 is ventilated simultaneously, as mentioned above. The ventilation can be done by escaping the atmospheric gas in the outer frame 101 to outside, for example, through a space in the cap 213. Meanwhile, white hollow arrows shown by the code number 520 show the flow direction of the atmospheric gas with ventilation.

Meanwhile, in humidity control of the gas mixture, it is preferable that the dehumidification be done such that a dew-point temperature of the gas mixture may become 10° C. or lower. In humidity control of the gas mixture, the dehumidification is done such that more preferably a dew-point temperature of the gas mixture may become 5° C. or lower, or still more preferably below −15° C.

As mentioned above, the humidity in the outer frame 101 is controlled by charging the gas mixture whose dew-point temperature is made below the prescribed value while ventilating the gas inside the outer frame 101.

Then, under the continuing condition of controlling the humidity in the outer frame 101 by charging the gas mixture whose dew-point temperature is made below the prescribed value while ventilating the gases inside the outer frame 101 as described above, a vacuum pump for degassing (not shown) is started thereby aspirating the preliminarily molded silica substrate 41 from its outer side through the aspiration holes 103 and the aspiration paths 104 and 105 and at the same time charging of electricity between the carbon electrodes 212 is started while rotating the outer frame 101 having the preliminarily molded silica substrate 41 at a certain constant rate.

When the arc discharge between the carbon electrodes 212 is started (shown by the numeral code 220), temperature of the inner surface part of the preliminarily molded silica substrate 41 reaches melting region of the powdered silica (estimated temperature in the range from about 1800 to about 2000° C.) thereby starting to melt from the most surface layer part. When the most surface layer part is melted, degree of vacuum by aspiration with the vacuum pump for degassing increases (pressure is dropped rapidly), the change to a fused silica glass layer progresses from inside to outside while dissolved gases contained in the powdered substrate's raw material 11 are being degassed.

Heating by the electric charge and aspiration by the vacuum pump are continued until about half of inside the entire silica substrate thickness is fused thereby forming the transparent to semitransparent layer part 51b (transparent layer part), while about half of outside remained becomes the sintered white and opaque silica 51a (opaque layer part). Degree of vacuum is made preferably $10^4$ Pa or lower, or more preferably $10^3$ Pa or lower.

The silica container 71 of the present invention may be made only with the silica substrate 51 formed by the processes up to this stage.

The atmospheric gas at the time when inside the silica substrate 51 is fused and sintered by the discharge-heating is under the condition of controlled humidity in the outer frame 101 by charging the gas mixture having its dew-point temperature made below the prescribed value and comprised of an $O_2$ gas and an inert gas while ventilating the gases inside the outer frame 101.

Because of this, the scattered carbons from the carbon electrodes 212 are gasified by oxidation with an $O_2$ gas; and thus the amount of carbon (C) contained in the silica substrate 51 can be made extremely small. As a result, a harmful effect to a material accommodated in the produced silica container 71 by carbon, carbon monoxide (CO), and carbon dioxide ($CO_2$) can be decreased. In addition, because the humidity is controlled to be kept at a low value so that the concentration of an OH group contained in the silica substrate 51 can be made extremely low, even below the desired value, thereby enabling to increase viscosity of the silica substrate 51; and thus the thermal distortion resistance under the use condition of the produced silica container 71 at high temperature can be improved. Further, an $H_2O$ gas molecule dissolved in the silica substrate 51 can be reduced.

Meanwhile, if the ratio of an $O_2$ gas contained in the foregoing gas mixture is made in the range from 1 to 40% by volume, the scattered carbon fine particles can be removed more effectively; and thus this range is preferable.

The silica container 71 of the present invention can be made only with the silica substrate 51 formed by the processes up to this stage, but as appropriate, as shown in FIG. 2, the inner layer 56 may be formed on the inner surface of the silica substrate 51, whereby the silica container 71' arranged with the silica substrate 51 and the inner layer 56 can be made to the silica container of the present invention.

The method for producing the silica container 71' arranged with the inner layer 56 as shown in FIG. 2 will be explained with referring to FIG. 4.

Figure 4:
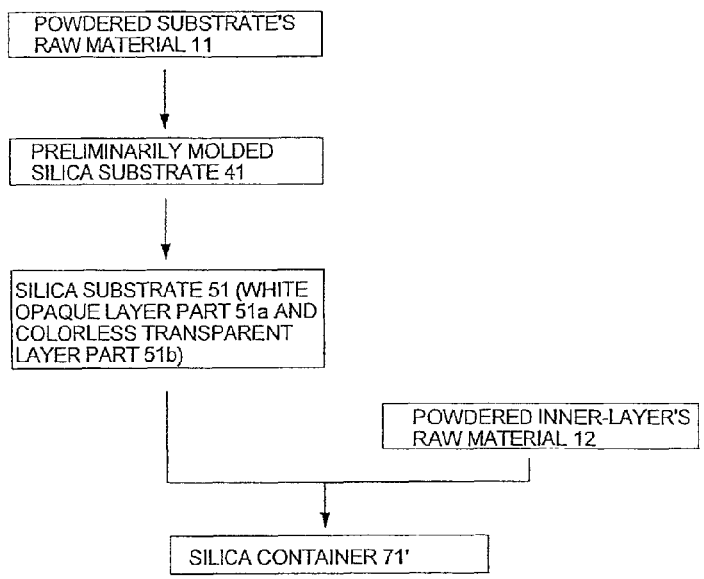
FIG. 4 is a flow chart showing outline of another example of the method for producing a silica container of the present invention.

Firstly, the steps up to form the silica substrate 51 are executed in a similar manner to those of Steps 1 to 3 as shown in the foregoing FIGS. 3 (1) to (3) (refer to FIGS. 4 (1) to (3)).

Then, as shown in FIG. 4 (4), the silica substrate 51 is heated from its inside by the discharge-heat melting method while the powdered inner-layer's raw material 12 comprised of silica particles and having a higher silica purity than the powdered substrate's raw material 11 is spread from inside the silica substrate 51, thereby forming the inner layer 56 on the inner surface of the silica substrate 51 (Step 4).

Alternatively, by repeating this Step 4, the inner layer 56 may be formed of a plurality of transparent silica glass layers having different purity and containing additives.

A basic method for forming the inner layer 56 is according to, for example, the contents described in Patent Document 6 and Patent Document 7.

Firstly, the powdered inner-layer's raw material 12 is prepared.

The material for the powdered inner-layer's raw material 12 includes a powdered natural quartz, which is purified to ultra high, a powdered natural berg crystal, a powdered synthetic cristobalite, and a powdered synthetic silica glass. A powdered crystalline silica is preferable for the purpose to reduce gaseous bubbles in the inner layer 56, while synthetic powders are preferable for the purpose of forming a transparent layer with a high purity. Particle diameter is preferably in the range from 10 to 1000 μm, or more preferably in the range from 100 to 500 μm. Purity is preferably 99.9999% or higher by weight as the silica component ($SiO_2$); while it is preferable that the concentration of each element of Li, Na, and K be 60 or less ppb by weight, and the concentration of each element of Ti, V, Cr, Fe, Co, Ni, Cu, Zn, Mo and W be 30 or less ppb by weight. It is more preferable that the concentration of each element of Li, Na, and K be 20 or less ppb by weight, and the concentration of each element of Ti, V, Cr, Fe, Co, Ni, Cu, Zn, Mo and W be 10 or less ppb by weight.

The powdered inner-layer's raw material 12 may be added (doped) with an $H_2$ gas.

Owing to an $H_2$ molecule contained in the powdered inner-layer's raw material 12, the amount of gaseous bubbles in the transparent silica glass layer that constitutes the inner layer 56 can be reduced so that a more perfect transparent layer may be formed. A mechanism of reducing gaseous bubbles in the fused transparent silica glass layer by an $H_2$ gas contained therein is not perfectly clear; but it may be assumed that an oxygen gas ($O_2$) (it has a large molecular diameter) contained in the powdered inner-layer's raw material 12 reacts with hydrogen to form water ($H_2O$), which is then released outside. In addition, $H_2$ itself is small in its molecular diameter and has a large diffusion coefficient; and thus even if $H_2$ is remained in the powdered inner-layer's raw material, it will not become a cause for generation of gaseous bubbles in the inner layer 56 in the subsequent steps.

Specifically, the amount of added $H_2$ is such that the amount of the $H_2$ released from the powdered inner-layer's raw material 12 when heated at 1000° C. under vacuum may be preferably in the range from $1\times10^{16}$ to $1\times10^{19}$ molecules/g, or more preferably in the range from $5\times10^{16}$ to $5\times10^{18}$ molecules/g. Meanwhile, if the particle diameter of the powdered inner-layer's raw material 12 is in the range from about 10 to about 1000 μm as mentioned above, almost all of $H_2$ is released at 1000° C. under vacuum; and thus, the amount of released $H_2$ at 1000° C. under vacuum is nearly equal to the dissolved amount of an $H_2$ molecule contained in the powdered inner-layer's raw material 12.

An $H_2$ gas can be contained into the powdered inner-layer's raw material 12, for example, by heating the powdered inner-layer's raw material 12 in an air-tight electric furnace made of a stainless steel jacket under an atmospheric gas comprised of 100% by volume of a hydrogen gas in the pressure range from 1 to 10 kgf/cm² (namely, in the range from about $10^5$ to about $10^6$ Pa, or about 1 to about 10 atmospheres), in the temperature range from 200 to 800° C. or preferably in the range from 400 to 600° C. and in the time range from about 1 to about 10 hours.

The method for forming the inner layer 56 will be explained with referring to FIG. 9.

The equipment for forming the inner layer 56 on the inner surface of the silica substrate 51 is comprised of, in similar to those of the previous step, the rotatable outer frame 101 having a revolution axis symmetry and arranged with the silica substrate 51, the rotation motor (not shown), the powdered raw material's hopper 303 containing the powdered inner-layer's raw material 12 for forming the inner layer 56, the agitating screw 304, the measuring feeder 305, the carbon electrodes 212 which are the heat source of the discharge-heat melting, the electric wirings 212a, the high voltage electricity source unit 211, the cap 213, and so forth. In addition, in the case of controlling the atmospheric gas, in similar to those in Step 3, the $O_2$ gas-supplying cylinder 411, the inert gas-supplying cylinder 412, the gas mixture-supplying pipe 420, the dehumidifying equipment 430, the dew-point-temperature-measuring thermometer 440, and so forth may be arranged.

The inner layer 56 is formed as follows; firstly, the outer frame 101 is set at the prescribed rotation speed, and then high voltage is loaded gradually from the high voltage electricity source unit 211 and at the same time the powdered inner-layer's raw material 12 for forming the inner layer 56 (high purity powdered silica) is spread gradually from top of the silica substrate 51 from the raw material's hopper 303. At this time, the electric discharge has been started between the carbon electrodes 212 so that inside the silica substrate 51 is in the temperature range of melting of the powdered silica (estimated temperature ranging from about 1800 to about 2000° C.); and with this, the spread powdered inner-layer's raw material 12 becomes to melted silica particles thereby attaching to the inner surface of the silica substrate 51. A mechanism is employed such that the carbon electrodes 212 arranged in the upper opening site of the silica substrate 51, a feeding port of the powdered raw material, and the cap 213 may change their positions relative to the silica substrate 51 to a certain degree; and by changing these positions, the inner layer 56 can be formed on the entire inner surface of the silica substrate 51 with a uniform thickness.

In the formation of the inner layer 56, in similar to those in the formation of the silica substrate 51 in Step 3 as described above, the atmospheric gas during fusing and sintering by the discharge-heating can be made under the condition of controlled humidity in the outer frame 101 by charging the gas mixture having its dew-point temperature made below the prescribed value and comprised of an $O_2$ gas and an inert gas while ventilating the gases inside the outer frame 101.

Figure 9:
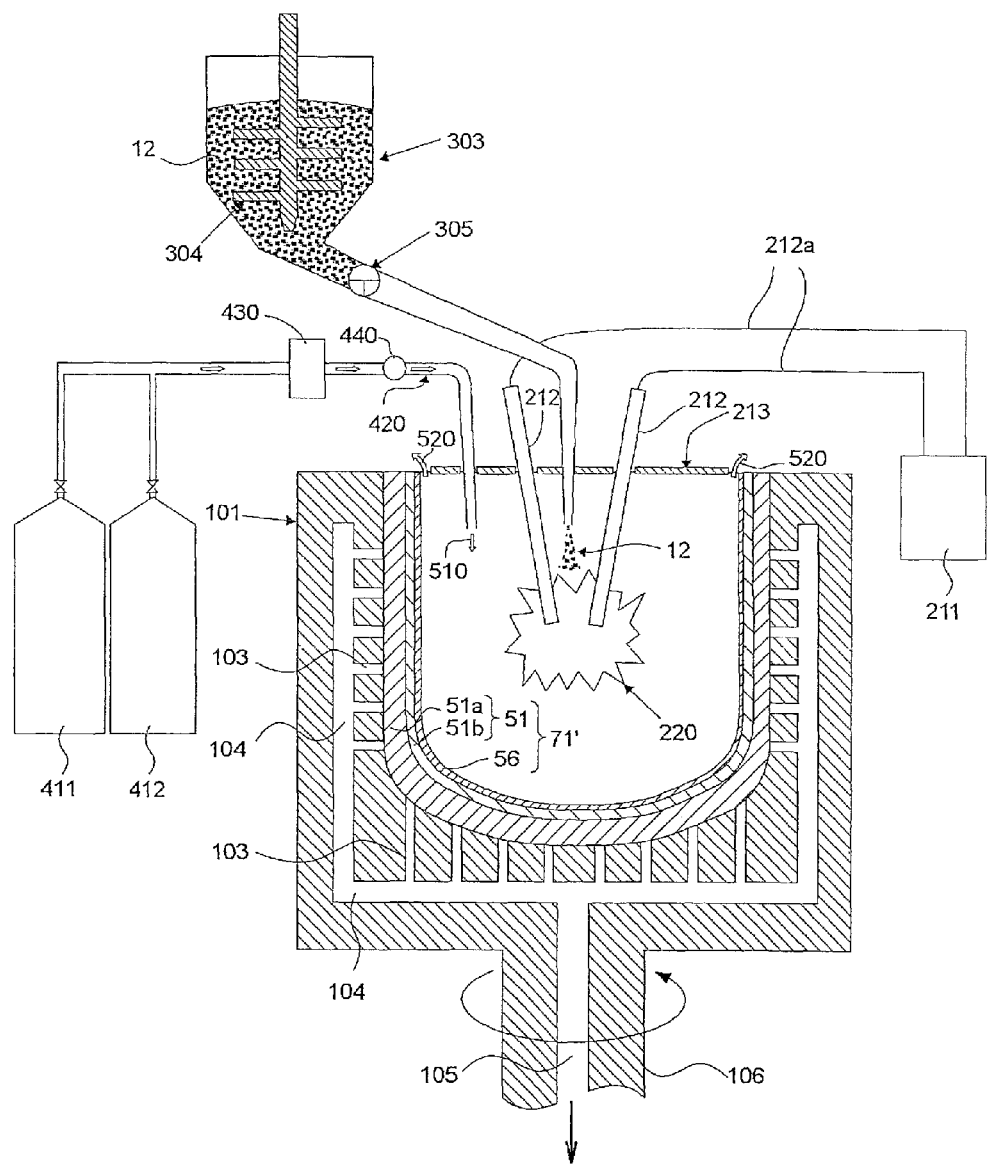
FIG. 9 is a schematic cross section view schematically showing one example of the step of forming the inner layer in the method for producing a silica container of the present invention.

Specifically, as shown in FIG. 9, an $O_2$ gas in the $O_2$ gas-supplying cylinder 411 and an inert gas (for example, nitrogen or argon) in the inert gas-supplying cylinder 412 are mixed and charged from inside the silica substrate 51 through the gas mixture-supplying pipe 420. Meanwhile, white hollow arrows shown by the code number 510 show the flow direction of the gas mixture. At this time, the gases in the outer frame 101 can be ventilated simultaneously, as mentioned above. The ventilation can be done, for example, by escaping the gases of the atmospheric inside the outer frame 101 to outside through a space in the cap 213. Meanwhile, white hollow arrows shown by the code number 520 show the flow direction of the gas mixture with ventilation.

In the way as described above, the silica container 71' of the present invention can be obtained; the silica container is cleaned as following when it is necessary.

[Cleaning and Drying of the Silica Container]

For example, the silica container is etched on its surface by an aqueous solution of hydrogen fluoride (HF) in the concentration range from about 1 to about 10% with the time for 5 to 30 minutes, washed by pure water, and then dried in a clean air.

By executing the foregoing steps, the silica container 71 and 71' of the present invention as mentioned above and shown in FIG. 1 and FIG. 2 can be produced.

According to the method for producing a silica container of the present invention as mentioned above, the invention can be executed by mere adding of widely used equipment such as a dehumidifying equipment to those of a conventional method without adding a special equipment and a process step; and thus a silica container containing extremely small amounts of carbon and an OH group can be produced in a high dimensional precision, a high productivity, and a low cost.

EXAMPLE

Hereinafter, the present invention will be explained more specifically by showing Examples and Comparative Examples of the present invention; but the present invention is not limited to them.

Example 1

According to the method for producing a silica container of the present invention as shown in FIG. 3, the silica container was produced as following.

Firstly, as shown in FIG. 3 (1), the powdered substrate's raw material 11 was prepared as following (Step 1).

Natural silica stones (100 kg) were prepared, heated in an air atmosphere at 1000° C. for 10 hours, poured into a pool of pure water whereby the stones were cooled quickly. After drying, the stones were crushed by a crusher to make total weight 90 kg of the powdered silica (the powdered natural silica stone) having particle diameter in the range from 50 to 500 µm and silica purity ($SiO_2$) of 99.999% or higher by weight.

Then, as shown in FIG. 3 (2) and FIG. 6, the powdered substrate's raw material 11 was fed to the inner wall 102 of the rotating outer frame 101, which is made of graphite with a column-like shape and has the aspiration holes 103 formed in the inner wall 102; a shape of the powdered substrate's raw material 11 was adjusted so as to obtain uniform thickness in accordance with the shape of the outer frame 101; in this way, the preliminarily molded silica substrate 41 was formed (Step 2).

Then, as shown in FIG. 3 (3), FIG. 7, and FIG. 8, the silica substrate 51 was formed by the discharge-heat melting method under aspiration (Step 3).

Specifically, at first an $O_2$ gas in the $O_2$ gas-supplying cylinder 411 and a nitrogen gas in the inert gas-supplying cylinder 412 were mixed (60% by volume of $N_2$ and 40% by volume of $O_2$) and then dehumidified by the dehumidifying equipment 430 to the dew-point temperature of 10° C. (measured by the dew-point-temperature-measuring thermometer 440); the resulting gas mixture was charged from inside the preliminarily molded silica substrate 41 through the gas mixture-supplying pipe 420 (white hollow arrow 510). On the other hand, gases in the outer frame 101 were ventilated (white hollow arrow 520). Under this condition, the preliminarily molded silica substrate 41 was aspirated for degassing from the outer peripheral side of the preliminarily molded silica substrate 41 (degree of aspiration was about $10^4$ Pa) through the aspiration holes 103 formed in the outer frame 101, at the same time the preliminarily molded silica substrate 41 was heated from the inside thereof at high temperature by the discharge-heat melting method with the carbon electrodes 212; with this, the outer peripheral part of the preliminarily molded silica substrate 41 was made to a sintered body and the inner part of the preliminarily molded silica substrate 41 was made to a fused glass body, thereby forming the silica substrate 51, which was made to the silica container 71.

The silica container 71 thus obtained was washed with 3% by weight of an aqueous solution of hydrogen fluoride (HF) for 3 minutes, rinsed with pure water, and then dried.

Example 2

Basically the same procedures as Example 1 were followed to produce the silica container 71, except for the following changes. The atmospheric gas at the time when the preliminarily molded silica substrate 41 was melted and sintered in Step 3 was made to a gas mixture including 80% by volume of $N_2$ and 20% by volume of $O_2$, the dew-point temperature was controlled at 7° C., and the amount of water vapor contained therein was made small.

Example 3

Basically the same procedures as Example 1 were followed to produce the silica container 71, except for the following changes. The atmospheric gas at the time when the preliminarily molded silica substrate 41 was melted and sintered in Step 3 was made to a gas mixture including 90% by volume of $N_2$ and 10% by volume of $O_2$, the dew-point temperature was controlled at 5° C., and the amount of water vapor contained therein was made small. At the same time, degree of vacuum by aspiration from the outer peripheral side was made higher as compared with Example 1 by controlled at $10^3$ Pa or lower.

Example 4

Basically the same procedures as Example 3 were followed to produce the silica container 71, except for the following changes. The atmospheric gas at the time when the preliminarily molded silica substrate 41 was melted and sintered in Step 3 was made to a gas mixture including 95% by volume of $N_2$ and 5% by volume of $O_2$, and the dew-point temperature was controlled at 5° C.

Example 5

According to the method for producing a silica container of the present invention as shown in FIG. 4, the silica container 71' was produced as following.

Firstly, Step 1 and Step 2 shown in FIGS. 4 (1) and (2) were followed in a similar manner to those of Step 1 and Step 2 of Example 1.

Then, procedures in Step 3 shown in FIG. 4 (3), FIG. 7, and FIG. 8 were followed in a similar manner to those of Step 3 in Example 1 except for the following changes. The atmospheric gas to be charged was made to a gas mixture including 90% by volume of $N_2$ and 10% by volume of $O_2$, the dew-point temperature was controlled at 5° C., and the amount of water vapor contained therein was made small.

Then, as shown in FIG. 4 (4) and FIG. 9 and described below, the inner layer 56 formed of a transparent silica glass was formed on an inner wall surface of the silica substrate 51 formed in Step 1 to Step 3 thereby making the silica container 71' (Step 4).

Firstly, a high purity powdered synthetic cristobalite (particle diameter in the range from 100 to 300 µm, and silica purity of 99.9999% or higher by weight) was prepared as the powdered inner-layer's raw material 12. To this powdered inner-layer's raw material 12 was added $3 \times 10^{17}$ molecules/g of an $H_2$ gas. Then, the powdered inner-layer's raw material 12 was spread from inside the silica substrate 51 under atmosphere of the gas mixture comprised of 90% by volume of $N_2$ and 10% by volume of $O_2$ with the dew-point temperature controlled at 5° C. while heating from inside thereof by the discharge-heat melting method thereby forming the inner layer 56 (thickness of 3 mm) formed of a transparent silica glass on the inner surface of the silica substrate 51; with this, the silica container 71' was made (Step 4).

Similar to Example 1, the silica container 71' thus obtained was washed with 3% by weight of an aqueous solution of hydrogen fluoride (HF) for 3 minutes, rinsed with pure water, and then dried.

Example 6

The silica container 71' was produced in a manner similar to those of Example 5, except that aluminum was added to the powdered substrate's raw material 11 so as to be contained therein with the concentration of 60 ppm by weight and the powdered inner-layer's raw material 12 was changed to a powdered synthetic cristobalite added with $3\times10^8$ molecules/g of $H_2$.

Example 7

The silica container 71 was produced in a manner similar to those of Example 1 and Example 2, except for the following changes. The atmospheric gas at the time when the preliminarily molded silica substrate 41 was melted and sintered in Step 3 was made to a gas mixture including 90% by volume of $N_2$ and 10% by volume of $O_2$, the dew-point temperature was controlled at −15° C., and the amount of water vapor contained therein was made small.

Example 8

The silica container 71 was produced in a manner similar to those of Example 7, except for the following changes. While the atmospheric gas at the time when the preliminarily molded silica substrate 41 was melted and sintered in Step 3 was still kept as a gas mixture including 90% by volume of $N_2$ and 10% by volume of $O_2$, the dew-point temperature was controlled at −20° C., and the amount of water vapor contained therein was made small.

Example 9

The silica container 71' was produced in a manner similar to those of Example 5, except for the following changes. Aluminum was added to the powdered substrate's raw material 11 so as to be contained therein with the concentration of 60 ppm by weight; and while the atmospheric gas at the time when the preliminarily molded silica substrate 41 was melted and sintered in Step 3 was still kept as a gas mixture including 90% by volume of $N_2$ and 10% by volume of $O_2$, the dew-point temperature was controlled at −15° C.

Example 10

The silica container 71' was produced in a manner similar to those of Example 6, except for the following changes. While the atmospheric gas at the time when the preliminarily molded silica substrate 41 was melted and sintered in Step 3 was still kept as a gas mixture including 90% by volume of $N_2$ and 10% by volume of $O_2$, the dew-point temperature was controlled at −20° C.

Comparative Example 1

According to mostly a conventional method, a silica container (a silica crucible) was prepared. Namely, a part corresponding to the silica substrate of the silica container of the present invention was formed by also using a high purity powdered raw material, under an air atmosphere without humidity control by the discharge-heat melting method.

Firstly, a high purity powdered natural quartz having silica purity of 99.9999% or higher by weight (particle diameter in the range from 100 to 300 μm) was prepared as the powdered raw material corresponding to the powdered substrate's raw material.

By using this powdered raw material under an air atmosphere without specific humidity control, this high purity powdered natural quartz was fed to a rotating frame made of graphite by utilizing a centrifugal force to form a powdered quartz layer in the rotating frame; the layer was then melted by discharge-heating with the carbon electrodes to form the silica substrate (corresponding to the silica substrate 51 of the present invention shown in FIG. 1). Time of this procedure was 60 minutes, and temperature near the inner surface of the silica substrate was estimated to be about 2000° C.

Comparative Example 2

In a similar manner to that of Comparative Example 1, firstly, the silica substrate (corresponding to the silica substrate 51 of the present invention as shown in FIG. 2) was formed.

Then, the same powdered synthetic cristobalite as in Examples 5, 6, 9, and 10 was prepared as the powdered raw material corresponding to the powdered inner-layer's raw material; then this high purity powdered synthetic cristobalite was spread from the hopper onto an inner surface of the silica substrate and was melted by the discharge-heating method with the carbon electrodes under an air atmosphere without specific humidity control to form the inner layer (corresponding to the inner layer 56 in the silica container 71' of the present invention, as shown in FIG. 2).

[Evaluation Methods in Examples and Comparative Examples]

Measurements of physical properties and property evaluation of the powdered raw material and gases used and the silica container produced in each Example and Comparative Example were carried out as shown below.

Method for Measuring Particle Diameter of Each Powdered Raw Material

Two-dimensional shape observation and area measurement of each powdered raw material were carried out with an optical microscope or an electron microscope. Then the diameter was obtained by calculation of the obtained area value with the assumption that shape of the particle is a true circle. This technique was repeated statistically to obtain the range of particle diameter (99% or more by weight of particles are included in this range).

Measurement of the Dew-Point Temperature

Measurement was done with a dew-point-temperature-measuring thermometer.

Meanwhile, the measurement in each Example was done by the dew-point-temperature-measuring thermometer 440 arranged in the gas mixture-supplying pipe 420, as mentioned above.

Analysis of the Impure Metal Element Concentration

When the impure metal element concentration is relatively low (i.e., the glass is of high purity), ICP-AES (Inductively Coupled Plasma-Atomic Emission Spectroscopy) or ICP-MS (Inductively Coupled Plasma-Mass Spectroscopy) was used, and when the impure metal element concentration is relatively high (i.e., the glass is of low purity), AAS (Atomic Absorption Spectroscopy) was used.

Thickness Measurement of Each Layer

The container cross section at the half part of total height of side wall of the silica container was measured by a scale to obtain thickness of the silica substrate and the inner layer.

Measurement of Concentration of an OH Group

The measurement was done with an infrared absorption spectroscopy. Conversion to concentration of an OH group was done according to the following literature:

Dodd, D. M. and Fraser, D. B., (1966), "Optical determination of OH in fused silica", Journal of Applied Physics, vol. 37, p. 3911.

Method for Measurement of Amount of Gas Molecules Released from Each of the Silica Substrates and the Inner Layers Each measurement sample of granules having the particle diameter in the range from 100 μm to 1 mm was prepared from the inner part of the silica substrate not containing gaseous bubbles (a colorless and transparent layer part, or in the case of Comparative Examples 1 an inner-most part having relatively small amount of gaseous bubbles) and from the inner layer of each of the silica containers in Examples and Comparative Examples, and then the sample thus obtained was arranged in a vacuum chamber; amounts and kinds of the released gases at 1000° C. under vacuum was then measured with a mass analyzer.

It was assumed that all amounts of an $H_2O$ gas, a CO gas, and a $CO_2$ gas were released; and the amount of each gas was expressed by numbers of the released molecules per unit mass (molecules/g). Details of the measurement were followed according to the following literature:

Nasu, S., et al., (1990), "Gas release of various kinds of vitreous silica", Journal of Illuminating Engineering Institute of Japan, vol. 74, No. 9, pp 595 to 600.

Analysis of the Amount of Contained Carbon Element (C)

With regard to each layer of the silica containers in Examples and Comparative Examples, a granular sample having the diameter controlled in the range from 100 to 1 mm was prepared for measurement. This granular sample for measurement was prepared in a sample chamber and burned with a high-frequency induction heating under an oxygen gas-containing atmosphere; and amounts of carbon monoxide (CO) and carbon dioxide ($CO_2$) produced by reaction of the sample with an oxygen gas were quantitatively analyzed by an infrared absorption method to analyze the amount of carbon element contained therein.

Viscosity

A material with the size of about 10×10 cm was cut out from each silica container, rinsed, and then kept in a clean electric furnace under an air atmosphere at 1150° C. for 3 hours. Then, the temperature was descended to 900° C. at the descendent rate of 10° C./hour; thereafter, the electric switch was turned off to allow the temperature be descended down to room temperature naturally in the electric furnace. With this heat treatment, the materials cut out from respective silica containers were made equal in their thermal histories. Then, each measurement sample having the size of 3×10 mm with 100 mm length and mirror-polished on the entire surface was prepared from the inside part of the silica substrate of the material not having gaseous bubbles (a colorless and transparent layer part, or in Comparative Examples 1 and 2 an inner-most part having relatively small amount of gaseous bubbles). Then, viscosity η at 1400° C. was measured by a beam bending method. Details were followed in the literature shown below.

Yoshikazu Kikuchi, et al., (1997), "OH Content Dependence of Viscosity of Vitreous Silica", Journal of the Ceramics Society of Japan, Vol. 105, No. 8, pp. 645-649.

Evaluation of Continuous Pulling Up of a Single Crystal Silicon (Multipulling)

A metal polysilicon with purity of 99.999999% by weight was fed into a produced silica container; thereafter, the temperature was raised to form a silicon melt, and then pulling up of a single crystal silicon was repeated for three times (multipulling). The evaluation was made as the success rate of single crystal growth. The pulling up conditions were: atmosphere of 100% of an argon gas (Ar) with the pressure inside the CZ equipment being $10^3$ Pa, 1 mm/minute of the pulling up rate, rotation numbers of 10 rpm, and size of the single crystal silicon with 150 mm in diameter and 150 mm in length. Operation time for one batch was set at about 12 hours. Classification of evaluation based on the success rate of single crystal growth for repetition of three times was made as following:

| | |
|---|---|
| three times: | good |
| two times: | fair |
| one time: | poor |

Evaluation of the Thermal Distortion Resistance of a Silica Container

In evaluation of the multipulling of a single crystal silicon as mentioned above, amount of collapse of the side wall upper part of a silica container toward inside thereof after the third pulling up was evaluated as following:

| | |
|---|---|
| amount of collapse toward inside was less than 1 cm: | good |
| amount of collapse toward inside was 1 cm or more and less than 2 cm: | fair |
| amount of collapse toward inside was 2 cm or more: | poor |

Evaluation of Voids and Pinholes

In the foregoing multipulling of the single crystal silicon, 10 sheets of silicon wafer having the size of 150 mm diameter and 200 μm thickness and polished on the both sides were prepared from an arbitrary portion of the first single crystal silicon after multipulling of each single crystal silicon. Then, voids and pinholes present on the both sides of each silicon wafer were counted; average void numbers and pinhole numbers per unit area ($m^2$) were obtained by a statistic numerical treatment.

| | |
|---|---|
| average number of voids and pinhole is less than $1/m^2$ | good |
| average number of voids and pinhole is in the range from 1 to $2/m^2$ | fair |
| average number of voids and pinhole is more than $3/m^2$ | poor |

Evaluation of (Relative) Production Cost of a Silica Container

The production cost of the silica container was evaluated. In particular, costs of silica raw materials, a melting energy, and so forth were summed up for the relative evaluation.

| | |
|---|---|
| low cost (less than 90% relative to cost of a conventional method): | good |
| moderate cost (90 to 110% relative to cost of a conventional method): | fair |
| high cost (higher than 110% relative to cost of a conventional method): | poor |

Production conditions, measured physical properties, and evaluation results of each silica container produced in Examples 1 to 10 and Comparative Examples 1 to 2 are summarized in the following Tables 1 to 6 and Table 7. Analysis data of impurity in the inner layer are shown in Table 7.

TABLE 1

| | Example 1 | Example 2 |
|---|---|---|
| Powdered substrate's raw material | Powdered natural silica Particle diameter: 50 to 500 μm Silica purity: 99.999% by weight | Powdered natural silica Particle diameter: 50 to 500 μm Silica purity: 99.999% by weight |
| Powdered inner-layer's raw material | No | No |
| Amount of $H_2$ released from powdered inner-layer's raw material (molecules/g) | — | — |
| Preliminary molding method of silica substrate | Rotation molding within graphite frame | Rotation molding within graphite frame |
| Melting-sintering method of silica substrate | Arc discharge melting under aspiration | Arc discharge melting under aspiration |
| Atmospheric gas during silica substrate formation | $N_2$: 60% by volume, $O_2$: 40% by volume Dew-point temperature: 10° C. | $N_2$: 80% by volume, $O_2$: 20% by volume Dew-point temperature: 7° C. |
| Melting method of inner layer | — | — |
| Atmospheric gas during inner layer melting | — | — |
| Physical properties of silica substrate — Color tone | White opaque to colorless transparent | White opaque to colorless transparent |
| Outer diameter, height, thickness (mm) | Outer diameter 450/ height 450/thickness 13 | Outer diameter 450/ height 450/thickness 13 |
| OH Concentration (ppm by weight) | 30 | 15 |
| Carbon Concentration (ppm by weight) | <10 | <10 |
| Amount of CO release (molecules/g) | $2 \times 10^{17}$ | $1 \times 10^{17}$ |
| Amount of $CO_2$ release (molecules/g) | $1 \times 10^{17}$ | $<1 \times 10^{17}$ |
| Amount of $H_2O$ release (molecules/g) | $3 \times 10^{17}$ | $2 \times 10^{17}$ |
| Al Concentration (ppm by weight) | 5 | 5 |
| log ($\eta$/Pa·s) of colorless and transparent layer at 1400° C. ($\eta$: viscosity (Pa·s)) | 10.4 | 10.4 |
| Physical properties of inner layer — Color tone | — | — |
| Thickness (mm) | — | — |
| OH Concentration (ppm by weight) | — | — |
| Carbon Concentration (ppm by weight) | — | — |
| Evaluation — Silicon single crystal multipulling | Fair | Fair |
| Thermal distortion resistance | Fair | Fair |
| Void/pinhole of silicon single crystal | Fair | Good |
| Cost | Good | Good |

TABLE 2

| | Example 3 | Example 4 |
|---|---|---|
| Powdered substrate's raw material | Powdered natural silica Particle diameter: 50 to 500 μm Silica purity: 99.999% by weight | Powdered natural silica Particle diameter: 50 to 500 μm Silica purity: 99.999% by weight |
| Powdered inner-layer's raw material | No | No |
| Amount of $H_2$ released from powdered inner-layer's raw material (molecules/g) | — | — |
| Preliminary molding method of silica substrate | Rotation molding within graphite frame | Rotation molding within graphite frame |
| Melting-sintering method of silica substrate | Arc discharge melting under strong aspiration | Arc discharge melting under strong aspiration |
| Atmospheric gas during silica substrate formation | $N_2$: 90% by volume, $O_2$: 10% by volume Dew-point temperature: 5° C. | $N_2$: 95% by volume, $O_2$: 5% by volume Dew-point temperature: 5° C. |

TABLE 2-continued

| | | Example 3 | Example 4 |
|---|---|---|---|
| Melting method of inner layer | | — | — |
| Atmospheric gas during inner layer melting | | — | — |
| Physical properties of silica substrate | Color tone | White opaque to colorless transparent | White opaque to colorless transparent |
| | Outer diameter, height, thickness (mm) | Outer diameter 450/ height 450/thickness 13 | Outer diameter 450/ height 450/thickness 13 |
| | OH Concentration (ppm by weight) | 10 | 15 |
| | Carbon Concentration (ppm by weight) | 10 | 20 |
| | Amount of CO release (molecules/g) | $<1 \times 10^{17}$ | $<1 \times 10^{17}$ |
| | Amount of $CO_2$ release (molecules/g) | $<1 \times 10^{17}$ | $<1 \times 10^{17}$ |
| | Amount of $H_2O$ release (molecules/g) | $1 \times 10^{17}$ | $1 \times 10^{17}$ |
| | Al Concentration (ppm by weight) | 5 | 5 |
| | log ($\eta$/Pa · s) of colorless and transparent layer at 1400° C. ($\eta$: viscosity (Pa · s)) | 10.5 | 10.5 |
| Physical properties of inner layer | Color tone | — | — |
| | Thickness (mm) | — | — |
| | OH Concentration (ppm by weight) | — | — |
| | Carbon Concentration (ppm by weight) | — | — |
| Evaluation | Silicon single crystal multipulling | Good | Fair |
| | Thermal distortion resistance | Fair | Fair |
| | Void/pinhole of silicon single crystal | Good | Good |
| | Cost | Good | Good |

TABLE 3

| | Example 5 | Example 6 |
|---|---|---|
| Powdered substrate's raw material | Powdered natural silica Particle diameter: 50 to 500 μm Silica purity: 99.999% by weight | Powdered natural silica Particle diameter: 50 to 500 μm Silica purity: 99.999% by weight |
| Powdered inner-layer's raw material | Powdered synthetic cristobalite Particle diameter: 100 to 300 μm Silica purity: 99.9999% by weight | Powdered synthetic cristobalite Particle diameter: 100 to 300 μm Silica purity: 99.9999% by weight |
| Amount of $H_2$ released from powdered inner-layer's raw material (molecules/g) | $3 \times 10^{17}$ | $3 \times 10^{18}$ |
| Preliminary molding method of silica substrate | Rotation molding within graphite frame | Rotation molding within graphite frame |
| Melting-sintering method of silica substrate | Arc discharge melting under aspiration | Arc discharge melting under aspiration |
| Atmospheric gas during silica substrate formation | $N_2$: 90% by volume, $O_2$: 10% by volume Dew-point temperature: 5° C. | $N_2$: 90% by volume, $O_2$: 10% by volume Dew-point temperature: 5° C. |
| Melting method of inner layer | Normal pressure arc discharge with spreading of powdered raw material | Normal pressure arc discharge with spreading of powdered raw material |
| Atmospheric gas during inner layer melting | $N_2$: 90% by volume, $O_2$: 10% by volume Dew-point temperature: 5° C. | $N_2$: 90% by volume, $O_2$: 10% by volume Dew-point temperature: 5° C. |
| Physical properties of silica substrate | Color tone | White opaque to colorless transparent | White opaque to colorless transparent |
| | Outer diameter, height, thickness (mm) | Outer diameter 450/ height 450/thickness 13 | Outer diameter 450/ height 450/thickness 13 |

TABLE 3-continued

|  |  | Example No. | |
|---|---|---|---|
|  |  | Example 5 | Example 6 |
|  | OH Concentration (ppm by weight) | 10 | 10 |
|  | Carbon Concentration (ppm by weight) | 10 | 10 |
|  | Amount of CO release (molecules/g) | $1 \times 10^{17}$ | $1 \times 10^{17}$ |
|  | Amount of $CO_2$ release (molecules/g) | $1 \times 10^{17}$ | $1 \times 10^{17}$ |
|  | Amount of $H_2O$ release (molecules/g) | $1 \times 10^{17}$ | $<1 \times 10^{17}$ |
|  | Al Concentration (ppm by weight) | 5 | 60 |
|  | log ($\eta$/Pa·s) of colorless and transparent layer at 1400° C. ($\eta$: viscosity (Pa·s)) | 10.6 | 10.7 |
| Physical properties of inner layer | Color tone | Colorless and transparent | Colorless and transparent |
|  | Thickness (mm) | 3 | 3 |
|  | OH Concentration (ppm by weight) | 15 | 20 |
|  | Carbon Concentration (ppm by weight) | <10 | <10 |
| Evaluation | Silicon single crystal multipulling | Good | Good |
|  | Thermal distortion resistance | Good | Good |
|  | Void/pinhole of silicon single crystal | Good | Good |
|  | Cost | Fair | Fair |

TABLE 4

|  |  | Example No. | |
|---|---|---|---|
|  |  | Example 7 | Example 8 |
| Powdered substrate's raw material |  | Powdered natural silica Particle diameter: 50 to 500 μm Silica purity: 99.999% by weight | Powdered natural silica Particle diameter: 50 to 500 μm Silica purity: 99.999% by weight |
| Powdered inner-layer's raw material |  | No | No |
| Amount of $H_2$ release from powdered inner-layer's raw material (molecules/g) |  | — | — |
| Preliminary molding method of silica substrate |  | Rotation molding within graphite frame | Rotation molding within graphite frame |
| Melting-sintering method of silica substrate |  | Arc discharge melting under aspiration | Arc discharge melting under aspiration |
| Atmospheric gas during silica substrate formation |  | $N_2$: 90% by volume, $O_2$: 10% by volume Dew-point temperature: −15° C. | $N_2$: 90% by volume, $O_2$: 10% by volume Dew-point temperature: −20° C. |
| Melting method of inner layer |  | — | — |
| Atmospheric gas during inner layer melting |  | — | — |
| Physical properties of silica substrate | Color tone | White opaque to colorless transparent | White opaque to colorless transparent |
|  | Diameter, height, thickness (mm) | Outer diameter 450/ height 450/thickness 13 | Outer diameter 450/ height 450/thickness 13 |
|  | OH Concentration (ppm by weight) | 8 | 5 |
|  | Carbon Concentration (ppm by weight) | 10 | 10 |
|  | Amount of CO release (molecules/g) | $<1 \times 10^{17}$ | $<1 \times 10^{17}$ |
|  | Amount of $CO_2$ release (molecules/g) | $<1 \times 10^{17}$ | $<1 \times 10^{17}$ |
|  | Amount of $H_2O$ release (molecules/g) | $<1 \times 10^{17}$ | $<1 \times 10^{17}$ |
|  | Al Concentration (ppm by weight) | 5 | 5 |
|  | log ($\eta$/Pa·s) of colorless and transparent layer at 1400° C. ($\eta$: viscosity (Pa·s)) | 10.6 | 10.6 |

TABLE 4-continued

|  |  | Example No. | |
| --- | --- | --- | --- |
|  |  | Example 7 | Example 8 |
| Physical properties of inner layer | Color tone | — | — |
|  | Thickness (mm) | — | — |
|  | OH Concentration (ppm by weight) | — | — |
|  | Carbon Concentration (ppm by weight) | — | — |
| Evaluation | Silicon single crystal multipulling | Good | Good |
|  | Thermal distortion resistance | Good | Good |
|  | Void/pinhole of silicon single crystal | Good | Good |
|  | Cost | Good | Good |

TABLE 5

|  |  | Example No. | |
| --- | --- | --- | --- |
|  |  | Example 9 | Example 10 |
| Powdered substrate's raw material | | Powdered natural silica<br>Particle diameter: 50 to 500 μm<br>Silica purity: 99.999% by weight | Powdered natural silica<br>Particle diameter: 50 to 500 μm<br>Silica purity: 99.999% by weight |
| Powdered inner-layer's raw material | | Powdered synthetic cristobalite<br>Particle diameter: 100 to 300 μm<br>Silica purity: 99.9999% by weight | Powdered synthetic cristobalite<br>Particle diameter: 100 to 300 μm<br>Silica purity: 99.9999% by weight |
| Amount of $H_2$ released from powdered inner-layer's raw material (molecules/g) | | $3 \times 10^{17}$ | $3 \times 10^{18}$ |
| Preliminary molding method of silica substrate | | Rotation molding within graphite frame | Rotation molding within graphite frame |
| Melting-sintering method of silica substrate | | Arc discharge melting under aspiration | Arc discharge melting under aspiration |
| Atmospheric gas during silica substrate formation | | $N_2$: 90% by volume, $O_2$: 10% by volume<br>Dew-point temperature: −15° C. | $N_2$: 90% by volume, $O_2$: 10% by volume<br>Dew-point temperature: −20° C. |
| Melting method of inner layer | | Normal pressure arc discharge with spreading of powdered raw material | Normal pressure arc discharge with spreading of powdered raw material |
| Atmospheric gas during inner layer melting | | $N_2$: 90% by volume, $O_2$: 10% by volume<br>Dew-point temperature: 5° C. | $N_2$: 90% by volume, $O_2$: 10% by volume<br>Dew-point temperature: 5° C. |
| Physical properties of silica substrate | Color tone | White opaque to colorless transparent | White opaque to colorless transparent |
|  | Outer diameter, height, thickness (mm) | Outer diameter 450/height 450/thickness 13 | Outer diameter 450/height 450/thickness 13 |
|  | OH Concentration (ppm by weight) | 8 | 5 |
|  | Carbon Concentration (ppm by weight) | 10 | 10 |
|  | Amount of CO release (molecules/g) | $<1 \times 10^{17}$ | $<1 \times 10^{17}$ |
|  | Amount of $CO_2$ release (molecules/g) | $<1 \times 10^{17}$ | $<1 \times 10^{17}$ |
|  | Amount of $H_2O$ release (molecules/g) | $<1 \times 10^{17}$ | $<1 \times 10^{17}$ |
|  | Al Concentration (ppm by weight) | 60 | 60 |
|  | log ($\eta$/Pa·s) of colorless and transparent layer at 1400° C. ($\eta$: viscosity (Pa·s)) | 10.7 | 10.8 |
| Physical properties of inner layer | Color tone | Colorless and transparent | Colorless and transparent |
|  | Thickness (mm) | 3 | 3 |
|  | OH Concentration (ppm by weight) | 15 | 20 |
|  | Carbon Concentration (ppm by weight) | <10 | <10 |
| Evaluation | Silicon single crystal multipulling | Good | Good |
|  | Thermal distortion resistance | Good | Good |

TABLE 5-continued

|  | Example No. | |
|---|---|---|
|  | Example 9 | Example 10 |
| Void/pinhole of silicon single crystal | Good | Good |
| Cost | Fair | Fair |

TABLE 6

|  |  | Example No. | |
|---|---|---|---|
|  |  | Comparative Example 1 | Comparative Example 2 |
| Powdered substrate's raw material | | Powdered natural silica Particle diameter: 100 to 300 μm Silica purity: 99.9999% by weight | Powdered natural silica Particle diameter: 100 to 300 μm Silica purity: 99.9999% by weight |
| Powdered inner-layer's raw material | | No | Powdered synthetic cristobalite Particle diameter: 100 to 300 μm Silica purity: 99.9999% by weight |
| Amount of $H_2$ released from powdered inner-layer's raw material (molecules/g) | | — | $<1 \times 10^{16}$ |
| Preliminary molding method of silica substrate | | Rotation molding within graphite frame | Rotation molding within graphite frame |
| Melting-sintering method of silica substrate | | Normal pressure arc discharge melting | Normal pressure arc discharge melting |
| Atmospheric gas during silica substrate formation | | Air, without dehumidification (Measured dew-point temperature: 15° C.) | Air, without dehumidification (Measured dew-point temperature: 17° C.) |
| Melting method of inner layer | | — | Normal pressure arc discharge with spreading of powdered raw material |
| Atmospheric gas during inner layer melting | | — | Air, without dehumidification (Measured dew-point temperature: 17° C.) |
| Physical properties of silica substrate | Color tone | White opaque | White opaque |
| | Outer diameter, height, thickness (mm) | Outer diameter 450/height 450/thickness 13 | Outer diameter 450/height 450/thickness 13 |
| | OH Concentration (ppm by weight) | 100 | 90 |
| | Carbon Concentration (ppm by weight) | 60 | 50 |
| | Amount of CO release (molecules/g) | $4 \times 10^{17}$ | $3 \times 10^{17}$ |
| | Amount of $CO_2$ release (molecules/g) | $2 \times 10^{17}$ | $2 \times 10^{17}$ |
| | Amount of $H_2O$ release (molecules/g) | $4 \times 10^{17}$ | $5 \times 10^{17}$ |
| | Al Concentration (ppm by weight) | 5 | 5 |
| | $\log (\eta/\text{Pa} \cdot \text{s})$ of colorless and transparent layer at 1400° C. ($\eta$: viscosity (Pa·s)) | 10.2 | 10.2 |
| Physical properties of inner layer | Color tone | — | Colorless and transparent |
| | Thickness (mm) | — | 3 |
| | OH Concentration (ppm by weight) | — | 130 |
| | Carbon Concentration (ppm by weight) | — | 30 |
| Evaluation | Silicon single crystal multipulling | Poor | Poor |
| | Thermal distortion resistance | Fair | Fair |
| | Void/pinhole of silicon single crystal | Poor | Fair |
| | Cost | Fair | Poor |

TABLE 7

(Unit: ppb by weight)

| Element | Example 5 | Example 6 | Example 9 | Example 10 | Comparative Example 2 |
|---|---|---|---|---|---|
| Li | 10 | 8 | 6 | 6 | 9 |
| Na | 42 | 40 | 41 | 40 | 40 |
| K  | 23 | 21 | 22 | 23 | 20 |
| Ti | 5  | 6  | 6  | 5  | 5  |
| V  | 2  | 3  | 2  | 2  | 2  |
| Cr | 10 | 8  | 9  | 9  | 8  |
| Fe | 25 | 20 | 23 | 22 | 25 |
| Co | 2  | 2  | 2  | 2  | 1  |
| Ni | 10 | 5  | 10 | 10 | 10 |
| Cu | 6  | 6  | 6  | 5  | 7  |
| Zn | 3  | 2  | 2  | 3  | 3  |
| Mo | 2  | 2  | 2  | 1  | 1  |
| W  | 1  | 1  | 1  | 1  | 1  |

As can be seen in Tables 1 to 5, in Examples 1 to 10 executed in accordance with the method for producing a silica container of the present invention, silica containers giving the results in pulling up of a single crystal no way inferior to a conventional silica container of Comparative Examples 1 and 2 could be obtained, even if silica containers produced in a low cost and a high productivity were used. In Examples 1 to 10, concentrations of carbon and an OH group contained in the silica container could be made lower as compared with Comparative Examples 1 and 2. Especially in Examples 5, 6, 9, and 10, in which the inner layer 56 was formed, amount of impure metal elements in the inner layer was in the same level as Comparative Example 2, as can be seen in Table 7; and thus it can be seen that a single crystal with a sufficiently high purity could be pulled up.

Accordingly, in Examples 1 to 10, multipulling of a single crystal silicon could be done with a high success rate; and thus formation of voids and pinholes could be made in the same level or lower as compared with Comparative Examples 1 and 2.

The thermal distortion resistance could be improved.

It must be noted here that the present invention is not limited to the embodiments as described above. The foregoing embodiments are mere examples; any form having substantially the same composition as the technical concept described in claims of the present invention and showing similar effects is included in the technical scope of the present invention.

The invention claimed is:

1. A method for producing a silica container comprised of at least a silica as its main component and arranged with a silica substrate having a rotational symmetry, wherein the method comprises:
   a step of preparing a powdered substrate's raw material comprised of silica particles for forming the silica substrate,
   a step of forming a preliminarily molded silica substrate, wherein the powdered substrate's raw material is fed to an inner wall of an outer frame having a rotational symmetry and aspiration holes arranged splittingly in the inner wall while rotating the outer frame thereby preliminarily molding the powdered substrate's raw material to an intended shape in accordance with the inner wall of the outer frame, and
   a step of forming the silica substrate, wherein the preliminarily molded silica substrate is degassed by aspiration from an outer peripheral side through the aspiration holes formed in the outer frame with controlling a humidity inside the outer frame by ventilating gases present in the outer frame with charging from inside the preliminarily molded silica substrate a gas mixture comprised of an $O_2$ gas and an inert gas and made below a prescribed dew-point temperature by dehumidification, and at the same time heated from inside the preliminarily molded silica substrate by a discharge-heat melting method with carbon electrodes, thereby making an outer peripheral part of the preliminarily molded silica substrate to a sintered body while an inner peripheral part of the preliminarily molded silica substrate to a fused glass body.

2. A method for producing a silica container, wherein the method for producing a silica container according to claim 1 further includes, after the step of forming the silica substrate by the discharge-heat melting method, a step of forming an inner layer formed of a transparent silica glass on an inner surface of the silica substrate, by spreading from inside the silica substrate a powdered inner-layer's raw material, comprised of silica particles and having a higher silica purity than the powdered substrate's raw material, with heating from inside the silica substrate by a discharge-heat melting method.

3. The method for producing a silica container according to claim 2, wherein the powdered inner-layer's raw material is made to the one that releases $H_2$ the amount of which is in the range from $1\times10^{16}$ to $1\times10^{19}$ molecules/g at 1000° C. under vacuum.

4. The method for producing a silica container according to claim 3, wherein, in the powdered inner-layer's raw material, each element concentration of Li, Na, and K is made 60 or less ppb by weight, and each element concentration of Ti, V, Cr, Fe, Co, Ni, Cu, Zn, Mo, and W is made 30 or less ppb by weight.

5. The method for producing a silica container according to claim 2, wherein, in the powdered inner-layer's raw material, each element concentration of Li, Na, and K is made 60 or less ppb by weight, and each element concentration of Ti, V, Cr, Fe, Co, Ni, Cu, Zn, Mo, and W is made 30 or less ppb by weight.

6. The method for producing a silica container according to claim 2, wherein the ratio of an $O_2$ gas contained in the gas mixture is in the range from 1 to 40% by volume.

7. The method for producing a silica container according to claim 2, wherein the dehumidification is done such that a dew-point temperature of the gas mixture may become 10° C. or lower.

8. The method for producing a silica container according to claim 2, wherein the powdered substrate's raw material is made to contain aluminum in the concentration rage from 10 to 500 ppm by weight.

9. The method for producing a silica container according to claim 1, wherein the ratio of an $O_2$ gas contained in the gas mixture is in the range from 1 to 40% by volume.

10. The method for producing a silica container according to claim 1, wherein the dehumidification is done such that a dew-point temperature of the gas mixture may become 10° C. or lower.

11. The method for producing a silica container according to claim 1, wherein the powdered substrate's raw material is made to contain aluminum in the concentration rage from 10 to 500 ppm by weight.

* * * * *